(12) United States Patent
Jeon et al.

(10) Patent No.: US 8,933,531 B2
(45) Date of Patent: Jan. 13, 2015

(54) SEMICONDUCTOR DEVICE HAVING SCHOTTKY DIODE STRUCTURE

(71) Applicant: Samsung Electro-Mechanics Co., Ltd., Suwon Gyunggi-do (KR)

(72) Inventors: Woo Cul Jeon, Suwon-si (KR); Jung Hee Lee, Daegu-si (KR); Young Hwan Park, Seoul (KR); Ki Yeol Park, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 5 days.

(21) Appl. No.: 13/666,393

(22) Filed: Nov. 1, 2012

(65) Prior Publication Data
US 2013/0056797 A1    Mar. 7, 2013

Related U.S. Application Data

(62) Division of application No. 12/654,936, filed on Jan. 8, 2010, now Pat. No. 8,319,309.

(30) Foreign Application Priority Data

Aug. 28, 2009  (KR) .......................... 10-2009-0080746
Aug. 28, 2009  (KR) .......................... 10-2009-0080747

(51) Int. Cl.
*H01L 27/14*   (2006.01)
*H01L 29/872*  (2006.01)
(Continued)

(52) U.S. Cl.
CPC ............ *H01L 29/872* (2013.01); *H01L 29/402* (2013.01); *H01L 29/66212* (2013.01); *H01L 29/2003* (2013.01); *H01L 29/205* (2013.01); *H01L 29/475* (2013.01); *H01L 29/7787* (2013.01)

USPC ........... 257/471; 257/485; 257/162; 257/141; 257/343; 257/E27.04; 257/E29.014; 257/E33.065; 257/E33.067; 257/459; 257/194

(58) Field of Classification Search
USPC ............ 257/471, 485, 162, 141, 343, E27.04, 257/E29.014, E33.065, E33.067, E33.068, 257/E33.051, E51.009, 459, 452, 476, 478, 257/194, 183, E29.012, E31.074
See application file for complete search history.

(56) References Cited

U.S. PATENT DOCUMENTS 7,582,905 B2 *  9/2009  Tamura et al. ................... 257/79
7,838,888 B2 * 11/2010  Yamamoto et al. .............. 257/77
(Continued)

FOREIGN PATENT DOCUMENTS

KR   10-2006-0093428    8/2006
KR   10-2006-0110002    10/2006

OTHER PUBLICATIONS

Korean Office Action issued Jul. 29, 2011 in corresponding Korean Patent Application 10-2009-0080746.
(Continued)

*Primary Examiner* — Michael Shingleton

(57) ABSTRACT

A semiconductor device including a base substrate; a semiconductor layer which is disposed on the base substrate and has a 2-Dimensional Electron Gas (2DEG) generated within the semiconductor layer; a plurality of first ohmic electrodes which are disposed on the central region of the semiconductor layer and have island-shaped cross sections; a second ohmic electrode which is disposed on edge regions of the semiconductor layer; and a Schottky electrode part has first bonding portions bonded to the first ohmic electrodes, and a second bonding portion bonded to the semiconductor layer. A depletion region is provided to be spaced apart from the 2DEG when the semiconductor device is driven at an on-voltage and is provided to be expanded to the 2DEG when the semiconductor device is driven at an off-voltage, the depletion region being generated within the semiconductor layer by bonding the semiconductor layer and the second bonding portion.

5 Claims, 34 Drawing Sheets

(51) Int. Cl.
 *H01L 29/40* (2006.01)
 *H01L 29/66* (2006.01)
 *H01L 29/20* (2006.01)
 *H01L 29/205* (2006.01)
 *H01L 29/47* (2006.01)
 *H01L 29/778* (2006.01)

(56) References Cited

U.S. PATENT DOCUMENTS

| | | | |
|---|---|---|---|
| 7,898,004 B2 | 3/2011 | Wu et al. | |
| 2003/0098462 A1* | 5/2003 | Yoshida | 257/183 |
| 2010/0140660 A1 | 6/2010 | Wu et al. | |
| 2011/0057286 A1 | 3/2011 | Jeon et al. | |
| 2011/0088456 A1 | 4/2011 | Ren et al. | |

OTHER PUBLICATIONS

Korean Office Action issued Jul. 29, 2011 in corresponding Korean Patent Application 10-2009-0080747.

U.S. Office Action issued Feb. 29, 2012 in copending U.S. Appl. No. 12/654,936.

U.S. Notice of Allowance issued Jul. 25, 2012 in copending U.S. Appl. No. 12/654,936.

* cited by examiner

SEMICONDUCTOR DEVICE HAVING SCHOTTKY DIODE STRUCTURE

CROSS-REFERENCE TO RELATED APPLICATIONS

This application is a divisional of U.S. application Ser. No. 12/654,936, filed on Jan. 8, 2010, which claims the benefit of Korean Patent Application Nos. 10-2009-0080746 and 10-2009-0080747, filed with the Korea Intellectual Property Office on Aug. 28, 2009, the disclosures of which are incorporated herein by reference.

BACKGROUND OF THE INVENTION

1. Field

The present invention relates to a semiconductor device; and, more particularly, to a semiconductor device having a Schottky diode structure, and a method for manufacturing the same.

2. Description of the Related Art

In general, an active device of semiconductor devices is used to configure a circuit, such as an amplifier, a voltage regulator, a current regulator, an oscillator, a logic gate, and so on. A diode of active devices is widely used as a detecting device, a rectifying device, and a switching device. As for a typical diode, a voltage regulator diode, a variable capacitance diode, a photo diode, a Light Emitting Diode (LED), a zener diode, a gunn diode, a Schottky diode, and so on are exemplified.

The Schottky diode of the exemplified diodes uses Schottky junction generated when a metal comes into contact with semiconductor. The Schottky diode can implement high-speed switching operation and low forward voltage driving. The nitride-based semiconductor device like the Schottky diode has a Schottky contact as an anode electrode, and an ohmic contact as a cathode electrode. However, in the Schottky diode with such a structure, there is a trade-off relation between satification of low on-voltage and on-current and reduction of a reverse leakage current. Thus, it is difficult to develop a nitride-based semiconductor device capable of operating at a low on-voltage and reducing a reverse leakage current.

SUMMARY

The present invention has been proposed in order to overcome the above-described problems and it is, therefore, an object of the present invention to provide a semiconductor device operable at a low on-voltage and a method for manufacturing the same.

Further, another object of the present invention is to provide a semiconductor device for reducing a reverse leakage current and a method for manufacturing the same.

Further, another object of the present invention is to provide a semiconductor device for increasing a breakdown current and a method for manufacturing the same.

Further, another object of the present invention is to provide a semiconductor device having a high forward current and a method for manufacturing the same.

In accordance with one aspect of the present invention to achieve the object, there is provided a semiconductor device including: a base substrate; a semiconductor layer which is disposed on the base substrate and has a 2-Dimensional Electron Gas (2DEG) formed therewithin; a first ohmic electrode disposed on a central region of the semiconductor layer; a second ohmic electrode which is formed on the edge regions of the semiconductor layer in such a manner to be disposed to be spaced apart from the first ohmic electrodes, and have a ring shape surrounding the first ohmic electrode; and a Schottky electrode part which is formed on the central region to cover the first ohmic electrode and is formed to be spaced apart from the second ohmic electrode.

The first ohmic electrode is bonded to the semiconductor layer of the central regions to thereby come into ohmic contact with the semiconductor layer, the second ohmic electrode is bonded to the semiconductor layer of the edge regions to thereby come into ohmic contact with the semiconductor layer, and the Schottky electrode part is bonded to the semiconductor layer on the middle regions between the central region and the edge regions to thereby come into ohmic contact with the semiconductor layer.

The semiconductor layer includes: a first nitride film which is disposed on the base substrate and has GaN material; and a second nitride film which is disposed on the first nitride film and has AlGaN material.

The Schottky electrode part includes: a central portion which covers a top surface of the first ohmic electrode; and edge portions which cover the semiconductor layer adjacent to a circumstance of the first ohmic electrode, wherein the edge portions of the Schottky electrode part are extended into the semiconductor layer.

The semiconductor layer includes: a first nitride film on the base substrate; a second nitride film which is disposed on the first nitride film and has an energy band gap wider than that of the first nitride film, wherein the edge portions of the Schottky electrode part are extended into the second nitride film, and are formed to be spaced apart from the first nitride film.

The semiconductor layer includes: a first nitride film formed on the base substrate; a second nitride film which is disposed on the first nitride film and has an energy band gap wider than that of the first nitride film, wherein the edge portions are extended into the first nitride film through the second nitride film.

The semiconductor layer includes: a first nitride film formed on the base substrate; a second nitride film which is disposed on the first nitride film and has an energy band gap wider than that of the first nitride film, wherein the first ohmic electrode is extended into the second nitride film and is formed to be spaced apart from the first nitride film.

The semiconductor layer includes: a first nitride film formed on the base substrate; a second nitride film which is disposed on the first nitride film and has an energy band gap wider than that of the first nitride film, wherein the first ohmic electrode is extended into the second nitride film through the first nitride film.

The semiconductor device further includes a filed plate disposed between the first ohmic electrode and the second ohmic electrode.

The field plate has internal side portions covered by the Schottky electrode, and external side portions covered by the second ohmic electrode, and central portions exposed.

In accordance with another aspect of the present invention to achieve the object, there is provided a semiconductor device including: a base substrate; a semiconductor layer which is disposed on the base substrate and has a 2DEG generated therewithin; a first ohmic electrode disposed on the central region of the semiconductor layer; a second ohmic electrode disposed on the edge regions of the semiconductor layer; and a Schottky electrode part provided with central portions bonded to the first ohmic electrode and edge portions bonded to the semiconductor layer, wherein a depletion region is provided to be spaced apart from the 2DEG when the semiconductor device is driven at an on-voltage, and is provided to be expanded to the 2DEG when the semiconductor device is driven at an off-voltage, the depletion region being generated within the semiconductor layer by bonding the semiconductor layer and the edge portions.

The central portion of the Schottky electrode part is disposed on a top part of the first ohmic electrode, and the edge portions of the Schottky electrode part are provided to be bonded to the semiconductor layer adjacent to a circumstance of the first ohmic electrode.

When the semiconductor device is driven at a forward voltage equal to or higher than the on-voltage of the Schottky electrode part, the depletion region is provided to allow a current to flow from the Schottky electrode part to the 2DEG.

When the semiconductor device is driven at a forward voltage lower than the on-voltage of the Schottky electrode part, the depletion region blocks a current flow from the Schottky electrode part to the 2DEG.

When the semiconductor device is driven at a reverse voltage, the depletion region blocks a current flow from the first ohmic electrode to the 2DEG.

In accordance with another aspect of the present invention to achieve the object, there is provided a method for manufacturing a semiconductor device including the steps of: preparing a base substrate; forming a semiconductor layer, which generates a 2DEG within the semiconductor layer, on the base substrate; forming a first ohmic electrode on a central region of the semiconductor layer; forming a second ohmic electrode having a ring shape surrounding the first ohmic electrode, on the edge regions of the semiconductor layer; and forming a Schottky electrode part, which entirely covers the first ohmic electrode and are spaced apart from the second ohmic electrode, on the semiconductor layer.

The step of forming the first ohmic electrode and the step of forming the second ohmic electrode are performed in in-situ.

The step of forming the semiconductor layer further includes a step of forming recesses on the semiconductor layer adjacent to a circumstance of the first ohmic electrode, after forming the first ohmic electrode, and the step of forming the Schottky electrode comprises a step of burring a metallic material different form that of the first ohmic electrode into the recesses.

The step of forming the semiconductor layer further includes a step of forming recesses on the central region and the edge regions of the semiconductor layer, before forming the first ohmic electrode, and the step of forming the first ohmic electrode and the step of forming the second ohmic electrode comprise a step of burring a metallic material different form that of the Schottky electrode into the recesses.

The method further includes a step of forming a field plate on middle regions between the central region and the edge regions of the semiconductor layer.

The step of forming the second ohmic electrode includes the steps of: forming a first metal film on the semiconductor layer; at least forming a first photoresist pattern exposing the first metal film on external side portions of the field plate; and etching the first metal film by using the first photoresist pattern as an etching mask, wherein the step of forming the Schottky electrode comprises the steps of: forming a second metal film different from the first metal film on the semiconductor layer after forming the second ohmic electrode; at least forming a second photoresist pattern exposing the second metal film on internal side portions of the field plate; and etching the second metal film by using the first photoresist pattern as an etching mask.

In accordance with another aspect of the present invention to achieve the object, there is provided a semiconductor device including: a base substrate; a semiconductor layer which is disposed on the base substrate and has a 2DEG generated within the semiconductor layer; a plurality of first ohmic electrodes with a shape protruded upward from a central region of the semiconductor layer; a second ohmic electrode with a ring shape formed along the edge regions of the semiconductor layer; and a Schottky electrode part which is formed to be spaced apart from the second ohmic electrode and covers the first ohmic electrode to thereby have a prominence and depression structure in which the Schottky electrode part is engaged with the first ohmic electrode up and down.

The first ohmic electrodes are disposed to be arranged in a lattice configuration within the Schottky electrode part.

The first ohmic electrode has a ring shape based on the center of the semiconductor layer, and the first ohmic electrodes each has a diameter different from one another.

The first ohmic electrodes are bonded to the semiconductor layer in the central region to thereby come into ohmic contact with the semiconductor layer, the second ohmic electrode is bonded to the semiconductor layer in the edge regions to thereby come into ohmic contact with the semiconductor layer, and the Schottky electrode is bonded to the semiconductor layer adjacent to the first ohmic electrodes to thereby come into ohmic contact with the semiconductor layer.

The semiconductor layer includes: a first nitride film which is disposed on the base substrate and has GaN material; and a second nitride film which is disposed on the first nitride film and has AlGaN material.

The Schottky electrode part is extended into the semiconductor layer and has a height lower than that of a bottom surface of the first ohmic electrodes.

The semiconductor layer includes: a first nitride film formed on the base substrate; and a second nitride film which is disposed on the first nitride film and has an energy band gap wider than that of the first nitride film, wherein the Schottky electrode part is extended to inside of the second nitride film and is spaced apart from the first nitride film.

The semiconductor layer includes: a first nitride film formed on the base substrate; and a second nitride film which is disposed on the first nitride film and has an energy band gap wider than that of the first nitride film, wherein the Schottky electrode part is extended to inside of the first nitride film through the second nitride film.

The semiconductor layer includes: a first nitride film formed on the base substrate; and a second nitride film which is disposed on the first nitride film and has an energy band gap wider than that of the first nitride film, wherein the first ohmic electrodes are extended to inside of the second nitride film and is spaced apart from the first nitride film.

The semiconductor layer includes: a first nitride film formed on the base substrate; and an energy film which is disposed on the first nitride film and has an energy band gap wider than that of the first nitride film, wherein the first ohmic electrodes are extended to inside of the second nitride film and are spaced apart from the first nitride film.

The semiconductor device further includes a field plate including an insulating film disposed between the first ohmic electrodes and the second ohmic electrode.

The field plat has internal side portions covered by the Schottky electrode, external side portions covered by the second ohmic electrodes, and central portions exposed.

In accordance with another aspect of the present invention to achieve the object, there is provided a semiconductor device including: a base substrate; a semiconductor layer which is disposed on the base substrate and has a 2-Dimensional Electron Gas (2DEG) generated within the semiconductor layer; a plurality of first ohmic electrodes which are disposed on the central region of the semiconductor layer and have island-shaped cross sections; a second ohmic electrode which is disposed on edge regions of the semiconductor layer; and a Schottky electrode part has first bonding portions bonded to the first ohmic electrodes, and a second bonding portion bonded to the semiconductor layer, wherein a depletion region is provided to be spaced apart from the 2DEG when the semiconductor device is driven at an on-voltage and is provided to be expanded to the 2DEG when the semiconductor device is driven at an off-voltage, the depletion region being generated within the semiconductor layer by bonding the semiconductor layer and the second bonding portion.

The Schottky electrode part has a prominence and depression structure in which the Schottky electrode part is engaged with the first ohmic electrodes up and down.

The first bonding portions are bonded to the first ohmic electrodes on a top part of the first ohmic electrodes, and the second bonding portion is bonded to a region of the semiconductor layer adjacent to the first ohmic electrodes.

When the semiconductor device is driven at a forward voltage equal to or higher than the on-voltage of the Schottky electrode part, the depletion region is provided to allow a current to flow from the Schottky electrode part to the 2DEG.

When the semiconductor device is driven at a forward voltage lower than the on-voltage of the Schottky electrode part, the depletion region blocks a current flow from the Schottky electrode part to the 2DEG.

When the semiconductor device is driven at a reverse voltage, the depletion region blocks a current flow from the first ohmic electrodes to the 2DEG.

In accordance with another aspect of the present invention to achieve the object, there is provided a method for manufacturing a semiconductor device including the steps of: preparing a base substrate; forming a semiconductor layer, which have a 2DEG generated within the semiconductor layer, on the base substrate; forming a plurality of first ohmic electrodes with a shape, protruded upward from the semiconductor layer, on a central region of the semiconductor layer; forming a second ohmic electrode having a ring shape formed along edge regions of the semiconductor layer; and forming a Schottky electrode part which entirely covers the first ohmic electrodes to thereby have a depression structure in which the Schottky electrode part is engaged with pillars of the electrodes up and down.

The step of forming the semiconductor layer further comprises a step of forming recesses on a region of the semiconductor layer adjacent to the first ohmic electrodes, after forming the first ohmic electrodes, and the step of forming the Schottky electrode comprises a step of burring metallic materials different form those of the first ohmic electrodes into the recesses.

The step of forming the recesses further includes the steps of: forming a photoresist pattern, exposing regions of the semiconductor layer adjacent to the first ohmic electrodes, on the semiconductor layer; and etching the semiconductor layer by using the photoresist pattern as an etching mask.

The method further includes a step of forming recesses on the central region and the edge regions of the semiconductor layer before the first ohmic electrodes are formed, and wherein the step of forming the first ohmic electrodes and the second ohmic electrodes comprises a step of burring metallic material different from that of the Schottky electrode part into the recesses.

In the step of forming the recesses, a plurality of contact holes disposed to be in a lattice configuration are formed on the central region.

In the step of forming the recesses, a trench having a ring shape based on a center of the semiconductor layer is formed on the semiconductor layer.

The method further includes a step of forming a field plate on middle regions between the central region and the edge regions of the semiconductor layer.

The step of forming the second ohmic electrodes includes the steps of: forming a first metal film on the semiconductor layer; at least forming a first photoresist pattern exposing the first metal film on external side portions of the field plate; and etching the first metal film by using the first photoresist pattern as an etching mask, wherein the step of forming a Schottky electrode comprises the steps of: forming a second metal film different from the first metal film after forming the second ohmic electrode; at least forming a second photoresist pattern exposing the second metal film on the internal side portions of the field plate; and etching the second metal film by using the second photoresist pattern as an etching mask.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DESCRIPTION OF EMBODIMENTS

Figure 1:
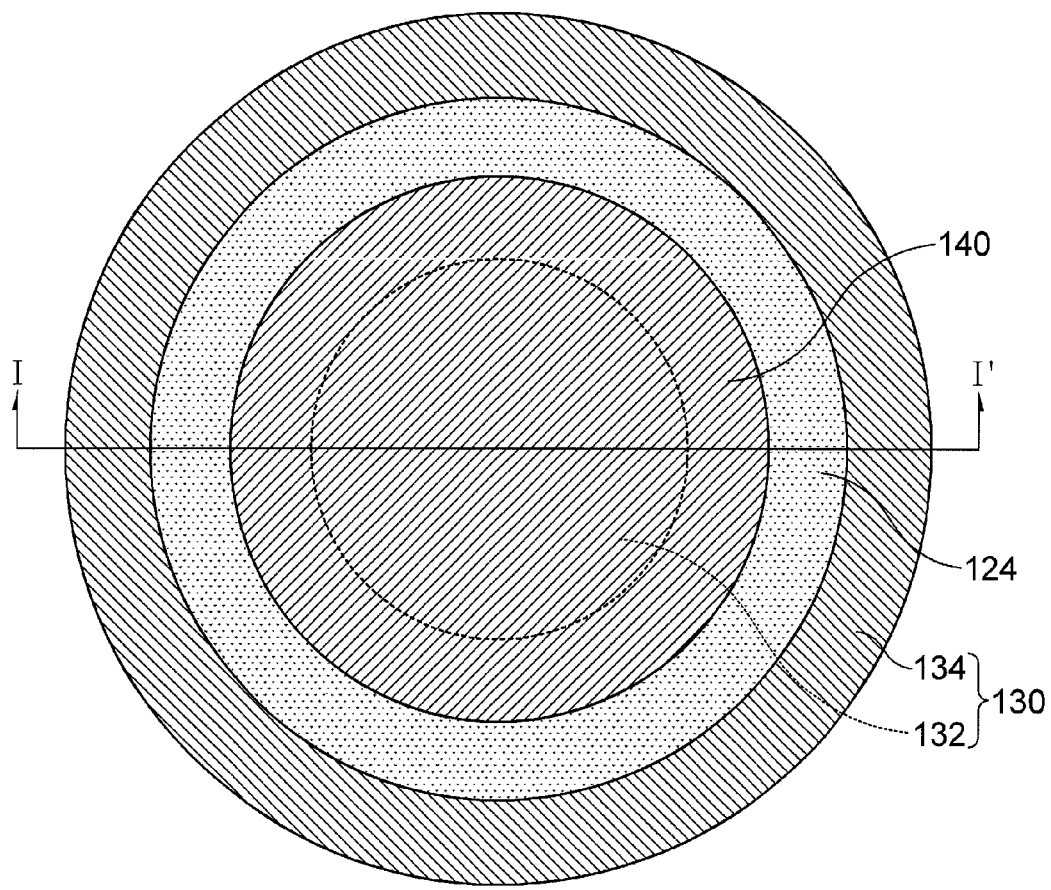
FIG. 1 is a plane-view showing a semiconductor device in accordance with one embodiment of the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Preferred embodiments of the invention will be described below with reference to cross-sectional views, which are exemplary drawings of the invention. The exemplary drawings may be modified by manufacturing techniques and/or tolerances. Accordingly, the preferred embodiments of the invention are not limited to specific configurations shown in the drawings, and include modifications based on the method of manufacturing the semiconductor device. For example, an etched region shown at a right angle may be formed in the rounded shape or formed to have a predetermined curvature. Therefore, regions shown in the drawings have schematic characteristics. In addition, the shapes of the regions shown in the drawings exemplify specific shapes of regions in an element, and do not limit the invention.

Hereinafter, a detailed description will be given of a semiconductor device and a method for manufacturing the same in accordance with embodiments of the present invention, with reference to accompanying drawings.

Figure 2:
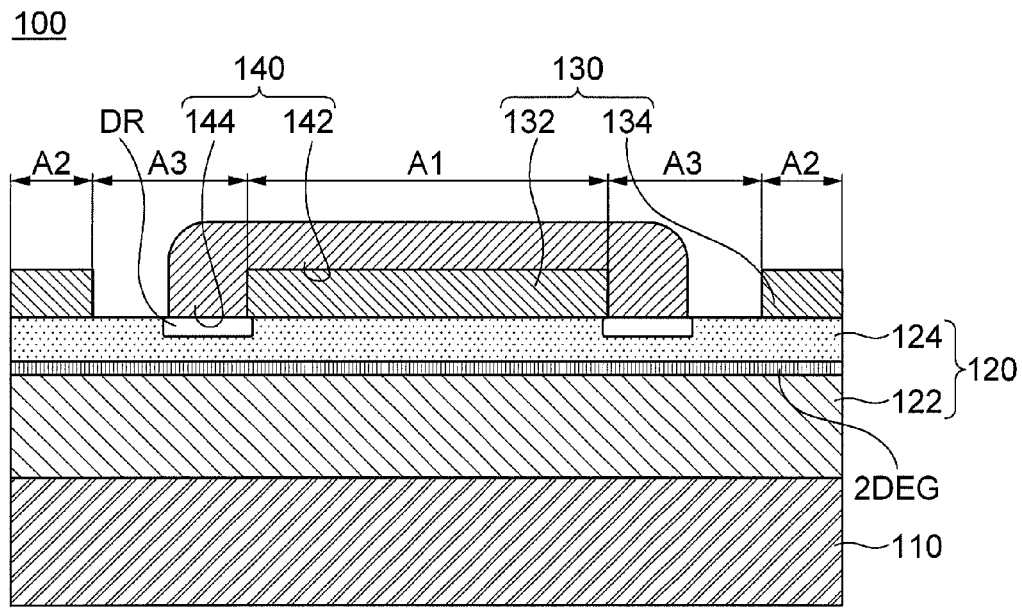
FIG. 2 is a cross-sectional view taken along a line I-I' of FIG. 1.

FIG. 1 is a plane-view showing a semiconductor device in accordance with one embodiment of the present invention, and FIG. 2 is a cross-sectional view taken along a line I-I' of FIG. 1.

Referring to FIGS. 1 and 2, the semiconductor device 100 may include a base substrate 110, a semiconductor layer 120, an ohmic electrode part 130, a Schottky electrode part 140.

The base substrate 110 may be a plate used for formation of the semiconductor device having a Schottky diode structure. For example, the base substrate 110 may be a semiconductor substrate. The base substrate 110 may correspond to at least one of a silicon substrate, a silicon carbide substrate, and a sapphire substrate.

The semiconductor layer 120 may be disposed on the base substrate 110. For example, the semiconductor layer 120 may include a first nitride film 122 and a second nitride film 124 which are sequentially stacked on the base substrate 110. The second nitride film 124 may be formed of a material having an energy band gap wider than that of the first nitride film 122. In addition, the second nitride film 124 may be formed of a material having a lattice parameter different from that of the first nitride film 122. For example, the first nitride film 122 and the second nitride film 124 may be films which contain a III-nitride-based material. In particular, the first nitride film 122 and the second nitride film 124 may be formed of any one of GaN, AlGaN, InGaN, and InAlGaN. For example, the first nitride film 122 may be a gallium nitride film, and the second nitride film 124 may be an aluminium gallium nitride film. Herein, the first nitride film 122 of the semiconductor layer 120 is formed of P-type GaN having high resistivity, thereby reducing a leakage current of the semiconductor device 100.

In the semiconductor layer 120 with the above-described structure, a 2-Dimensional Electron Gas (2DEG) may be generated on the boundary of the first nitride film 122 and the second nitride film 124. When the semiconductor device 100 is operated, a current flows through the 2DEG. Meanwhile, a buffering film (not shown) may be further provided between the base substrate 110 and the first nitride film 122 so as to solve problems caused by lattice mis-match generated between the base substrate 110 and the first nitride film 122.

The ohmic electrode part 130 may be disposed on the second nitride film 124. For example, the ohmic electrode part 130 may include a first ohmic electrode 132 and a second ohmic electrode 134. The first ohmic electrode 132 may be disposed on a central region A1 of the second nitride film 124. The second ohmic electrode 134 may be disposed on edge regions A2 of the second nitride film 124 so that it can surround the first ohmic electrode 132. Thus, the second ohmic electrode 134 may be generally formed in a ring shape. Also, the second ohmic electrode 134 may be disposed to be spaced apart from the first ohmic electrode 132 at a predetermined space.

The Schottky electrode part 140 may be provided to cover the first ohmic electrode 132. For example, the Schottky electrode part 140 may be provided on the central region A1 of the second nitride film 124 so that it can entirely cover the first ohmic electrode 132. Thus, the central portion 142 of the Schottky electrode part 140 covers a top surface of the first ohmic electrode 132, and the edge portions 144 of the Schottky electrode part 140 may cover side surfaces of the first ohmic electrode 132. In addition, the edge portions 144 of the Schottky electrode part 140 may cover a part of the second nitride film 124 exposed to middle regions A3 between the central region A1 and the edge regions A2. Herein, the edge portions 144 of the Schottky electrode part 140 may be provided to be spaced apart from the second ohmic electrode 134, respectively.

In the semiconductor device 100 having the same structure, the first ohmic electrode 132 comes into ohmic contact with the second nitride film 124 in the central region A1, and the second ohmic electrode 134 comes into ohmic contact with the second nitride film 124 in the edge regions A2. The second nitride film 124 may come into Schottky contact with the Schottky electrode part 140 in the middle regions A3. Also, the Schottky electrode part 140 may be used as an anode electrode, and the second ohmic electrode 134 may be used as a cathode electrode.

Meanwhile, the ohmic electrode part 130 and the Schottky electrode part 140 may be formed of various materials. For example, the first ohmic electrode 132 and the second ohmic electrode 134 may be formed of the same metallic material, and the Schottky electrode part 140 may be formed of metallic material different from those of the first and second ohmic electrodes 132 and 134. For example, the first and second ohmic electrodes 132 and 134 may be formed of a metallic material composed of at least one of Al, Mo, Au, Ni, Pt, Ti, Pd, Ir, Rh, Co, W, Ta, Cu, Zn. On the contrary, the Schottky electrode part 140 may be formed of a material composed of one or more metal elements different from that of the ohmic electrode part 130. Continuously, a detailed description will be given of various operation states of the semiconductor device 100 in accordance with an embodiment of the present invention.

Continuously, a detailed description will be given of various operation states of the semiconductor device in accordance with one embodiment of the present invention having been described with reference to FIGS. 1 and 2.

Figure 3A:
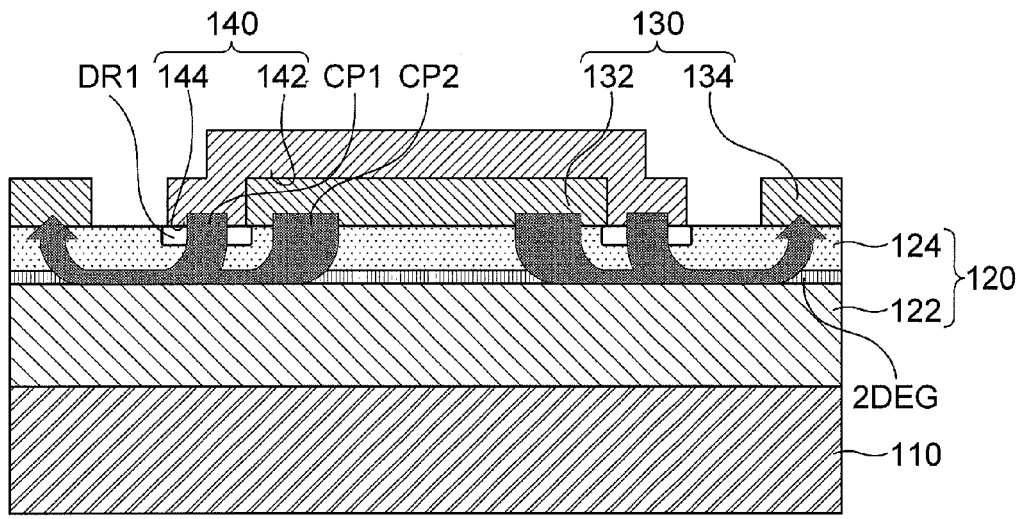
FIGS. 3A to 3C are views showing operation states of the semiconductor device shown in FIG. 1, respectively.
Figure 3B:
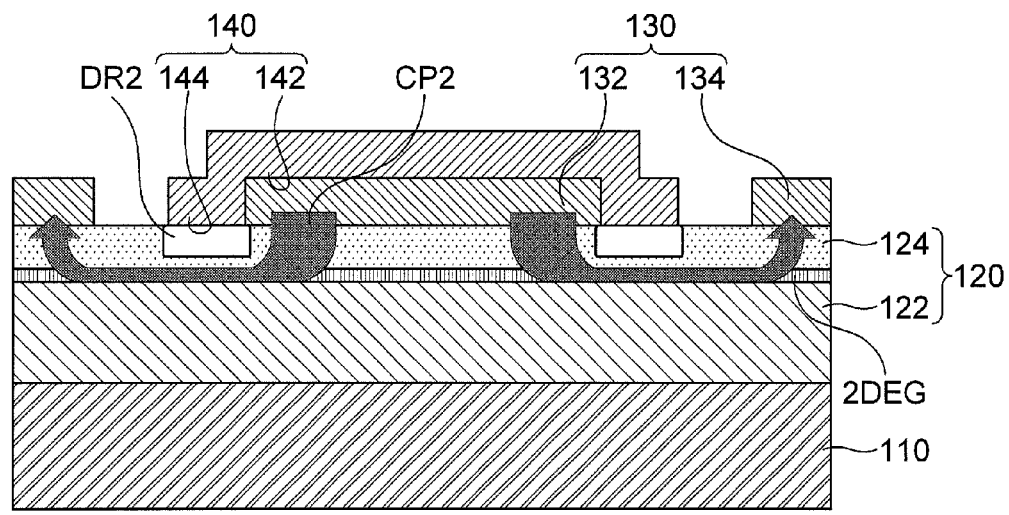
Figure 3C:
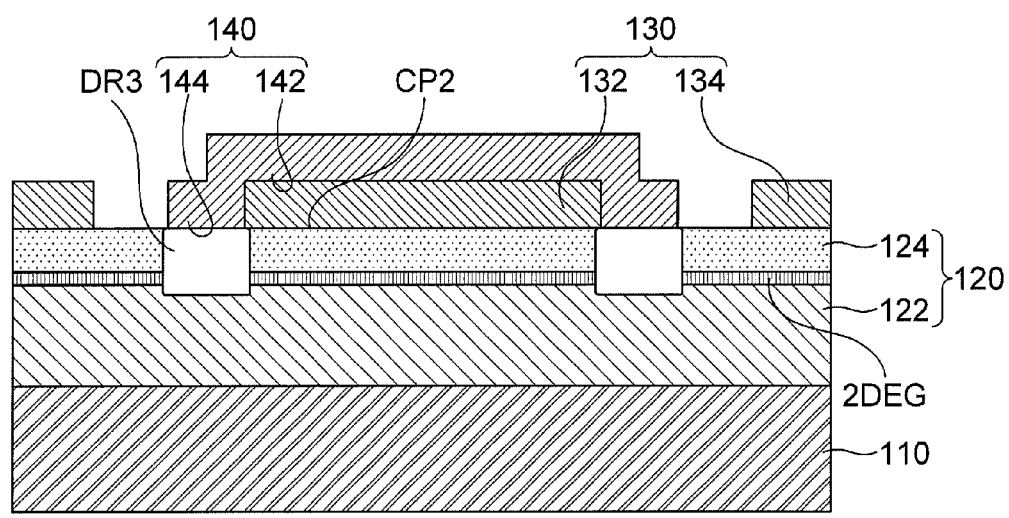

FIGS. 3A to 3C are views showing operation states of the semiconductor device shown in FIG. 1, respectively. FIG. 3A is a view showing an operation state of the semiconductor device when driven at a forward voltage equal to or higher than an on-voltage of the Schottky diode. Referring to FIG. 3A, when the semiconductor device 100 in accordance with one embodiment of the present invention is driven at a first forward voltage equal to or higher than the on-voltage of the Schottky diode, a depletion region (DR1) generated where the second semiconductor layer 120 and the Schottky electrode part 140 are joined together may be relatively reduced. Thus, in the semiconductor device 100, a current may flow through a first current path CP1 and a second current path CP2, wherein the first current path CP1 passes through the 2DEG from the first ohmic electrode 132, and the second current path CP2 passes through the 2DEG from the Schottky electrode part 140. In this case, since forward currents of the semiconductor device 100 are increased, it is possible to operate the semiconductor device 100 even at a low on-voltage.

FIG. 3B is a view showing an operation state of the semiconductor device when driven at a forward voltage lower than an on-voltage of the Schottky diode. Referring to FIG. 3B, when the semiconductor device 100 in accordance with one embodiment of the present invention is driven at a second forward voltage lower than the on-voltage of the Schottky diode, a depletion region DR2 generated where the second semiconductor layer 120 and the Schottky electrode part 140 are joined together may be more expanded than the depletion region DR1 corresponding to a case where the semiconductor device 100 is driven at the first forward voltage as described in FIG. 3A. Such the expanded depletion region DR2 may be wide enough to block a current flow between the second semiconductor layer 124 and the Schottky electrode part 140. However, the second forward voltage may be controlled such that the depletion region DR2 fails to be expanded to the 2DEG. Thus, in the semiconductor device 100, a current may flow through the second current path CP2 alone.

FIG. 3C is a view showing an operation state of the semiconductor device when driven at a reverse voltage. Referring to FIG. 3C, when the semiconductor device 100 is driven at the reverse voltage, a depletion region DR3 may be more expanded to the 2DEG than the depletion region DR2 shown in FIG. 3B. Such the depletion region DR3 allows the 2DEG to be disconnected to thereby increase a reverse breakdown current, so that it is possible to block all current flows passing through the first and second current paths CP1 and the CP2.

As described above, when the semiconductor device 100 is driven in the forward direciton, a current may flow to the second ohmic electrode 134 by the first ohmic electrode 132 positioned below the Schottky electrode part 140 even in a state where the driving voltage is lower than the on-voltage of the Schottky diode, simultaneously while the current may flow through the first ohmic electrode 132 and the Schottky electrode part 140 in a state where the driving voltage is higher than the on-voltage of the Schottky diode. Thus, since the semiconductor device 100 may increase forward currents, it can be operated even at a low driving voltage. Also, when the semiconductor device 100 is driven in the reverse direction, the depletion region DR3 generated by the Schottky electrode part 140 allows the 2DEG to be disconnected, thereby stably blocking a current flow.

Hereinafter, a description will be given of a method for manufacturing the semiconductor device in accordance with the embodiment of the present invention. Herein, the repeated description for the semiconductor device will be omitted or simplified.

Figure 4A:
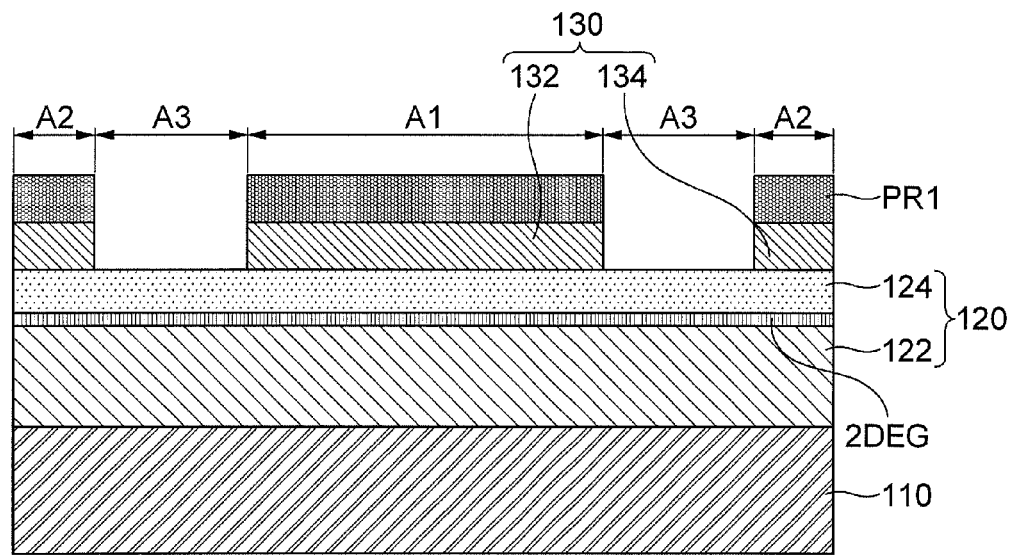
FIGS. 4A to 4C are views showing methods for manufacturing the semiconductor device in accordance with one embodiment of the present invention, respectively.
Figure 4B:
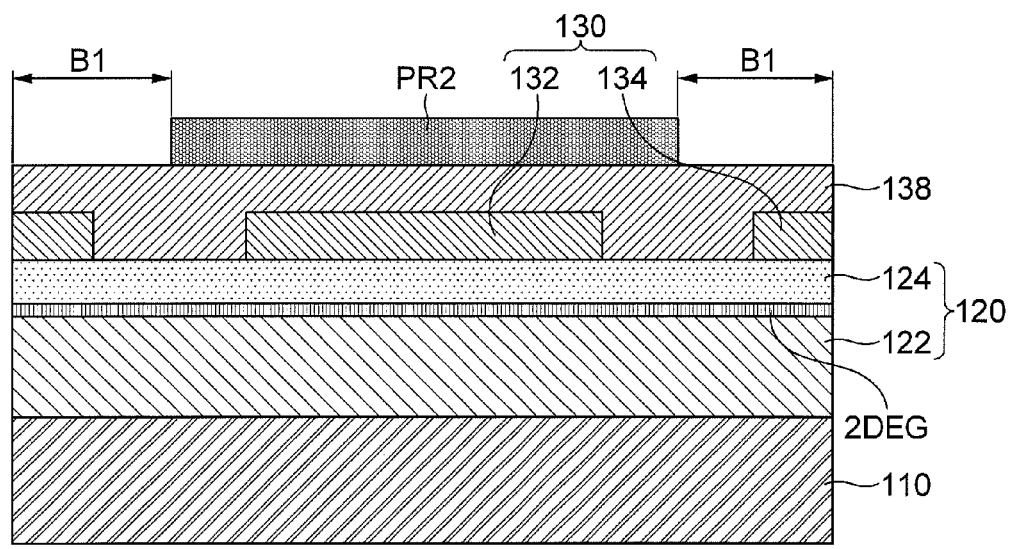
Figure 4C:
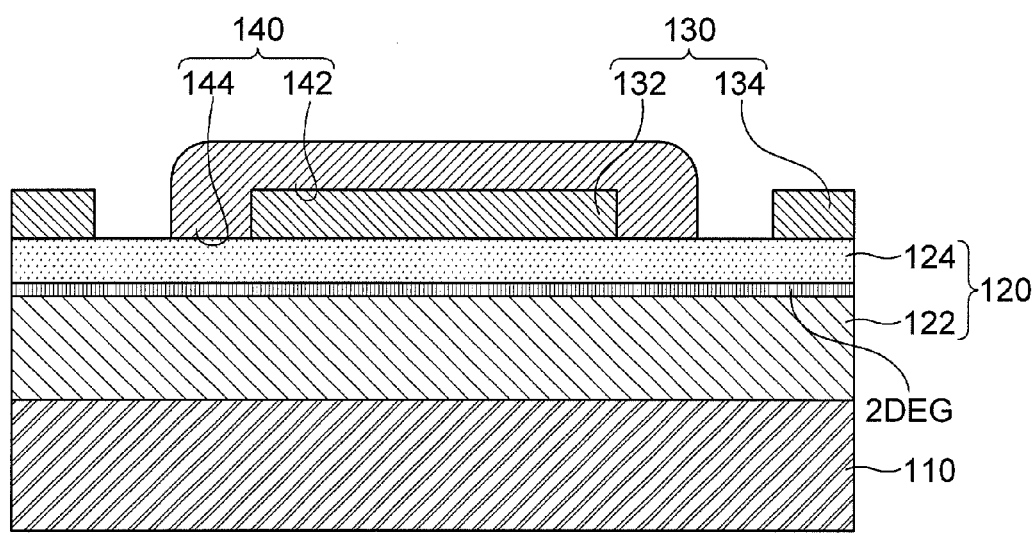

FIGS. 4A to 4C are views showing methods for manufacturing the semiconductor device 100 in accordance with one embodiment of the present invention, respectively.

Referring to FIG. 4A, the base substrate 110 may be prepared. A step of preparing the base substrate 110 may include a step of preparing a semiconductor substrate. The step of preparing the base substrate 110 may include a step of preparing at least one of a silicon substrate, a silicon carbide substrate, and a sapphire substrate.

The semiconductor layer 120 may be formed on the base substrate 110. A step of forming the semiconductor layer 120 may include a step of forming the first nitride film 122 on the base substrate 110, and a step of forming the second nitride film 124 on the first nitride film 122. For example, the step of forming the semiconductor layer 120 may be achieved by epitaxial-growing the first nitride film 122 by using the base substrate 110 as a seed layer, and then epitaxial-growing the second nitride film 124 by using the epitaxial-grown first nitride film 122 as a seed layer. As for an epitaxial growth process for forming the first and second nitride films 122 and 124, at least one of a molecular beam epitaxial growth process, an atomic layer epitaxial growth process, a flow modulation organometallic vapor phase epitaxial growth process, a flow modulation organometallic vapor phase epitaxial growth process, and a hybrid vapor phase epitaxial growth process may be used. Furthermore, as for another process for forming the first and second nitride films 122 and 124, at least one of a chemical vapor deposition process and a physical vapor deposition process may be used.

The ohmic electrode portion 130 may be formed on the semiconductor layer 120. For example, a first metal film may be formed on the second nitride film 124. A step of forming the first metal film may include a step of forming a metal film, which is composed of at least one of Au, Ni, Pt, Ti, Al, Pd, Ir, Rh; Co, W, Mo, Ta, Cu, and Zn, on the second nitride film 124 in a conformal manner. Thereafter, a step of forming a first photoresist pattern PR1 on the first metal film, a step of etching the first metal film by using the first photoresist pattern PR1 as an etching mask, and a step of removing the first photoresist pattern PR1 may be sequentially performed. The step of forming the first photoresist pattern PR1 may include a step of forming a first photoresist film on the first metal film, and then removing the first photoresist film on middle regions A3 such that the middle regions A3 between a central region A1 and edge regions A2 of the first metal film can be exposed. Thus, the first ohmic electrode 132 positioned on the central region A1 and the second ohmic electrode 134 positioned on the edge regions A2 may be formed on the second nitride film 124. The second nitride film 124 on the middle regions A3 may be exposed. Herein, since the first ohmic electrode 132 and the second ohmic electrode 134 are simultaneously formed in the same etching process, they may be formed of the same metallic material. To this end, the first ohmic electrode 132 and the second ohmic electrode 134 may be formed in an in-situ scheme. Meanwhile, a process of planarizing the first metal film may be added before the first metal film is etched.

Referring to FIG. 4B, a second metal film for covering all surfaces of a resultant ohmic electrode part 130 may be formed. The second metal film 138 may be formed of a metallic film different from that of the ohmic electrode part 130. Thereafter, the second photoresist pattern PR2 for exposing edge regions B1 of the second metal film 138 may be formed on the second metal film 138. Herein, the edge regions B1 of the second metal film 138 may be regions including all of the edge regions A2 and a part of the middle regions A3 of the first metal film 134 of FIG. 4A.

Referring to FIG. 4C, a second photoresist pattern, indicated by reference numeral PR2 of FIG. 4B, is used as an etching mask for etching the second metal film 138. Thus, the Schottky electrode part 140 for entirely covering the first ohmic electrode 132 may be formed on the second nitride film 124. Herein, the Schottky electrode part 140 may be disposed to be spaced apart from the second ohmic electrode 134. Thus, the region of the second nitride film 124 between the first ohmic electrode 132 and the second ohmic electrode 134 may be exposed. By removing the second photoresist pattern PR2, it is possible to form the semiconductor device 100 as shown in FIGS. 1 and 2.

Hereinafter, a description will be given of various modified examples of the semiconductor device in accordance with one embodiment of the present invention. The repeated description for the same components between the above-described semiconductor device and semiconductor devices in accordance with various modified embodiments will be omitted or simplified. Since those skilled in the art can analogize operation processes of the modified examples to be described from the operation states of the semiconductor device having been described with reference to FIGS. 3A to 3C, the description for the operation processes of the modified examples will be omitted. Also, the modified examples to be described may be combined with one another and combined technologies of the modified examples may be enough derived from each of modified examples, so detailed combined technologies will be omitted.

Figure 5:
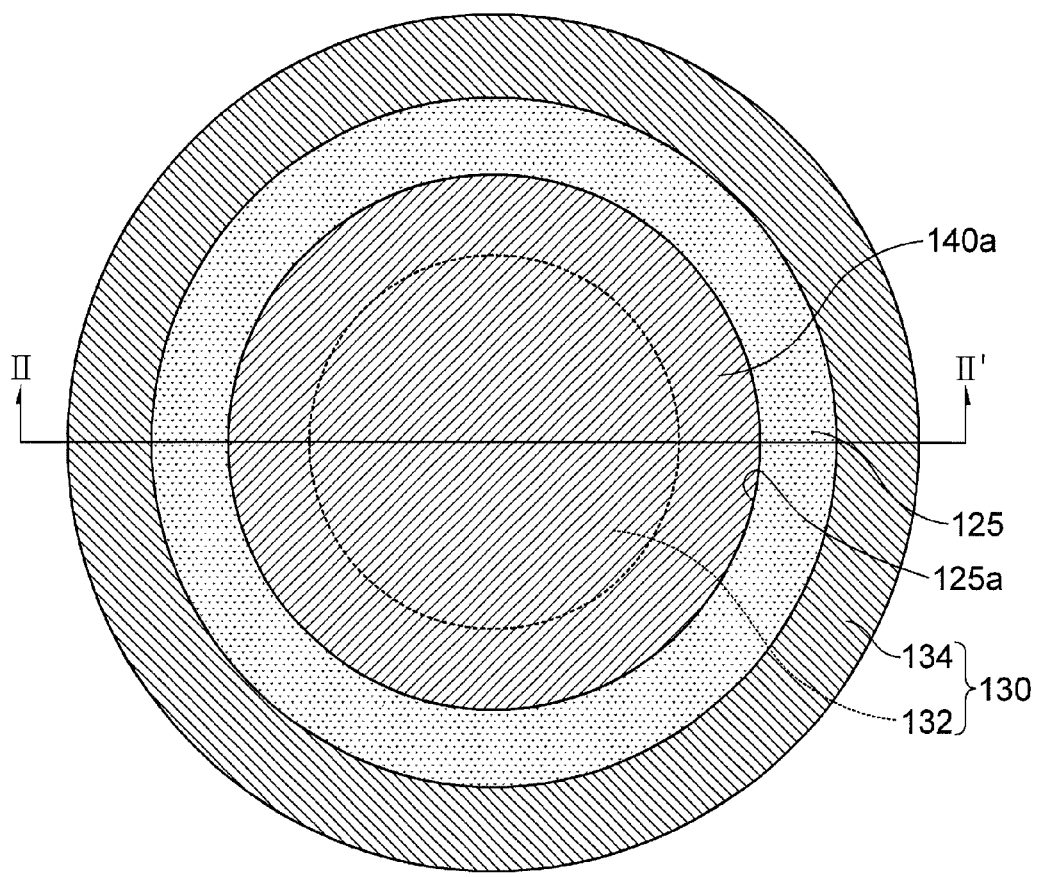
FIG. 5 is a plane-view showing a modified example of a semiconductor device in accordance with one embodiment of the present invention.
Figure 6:
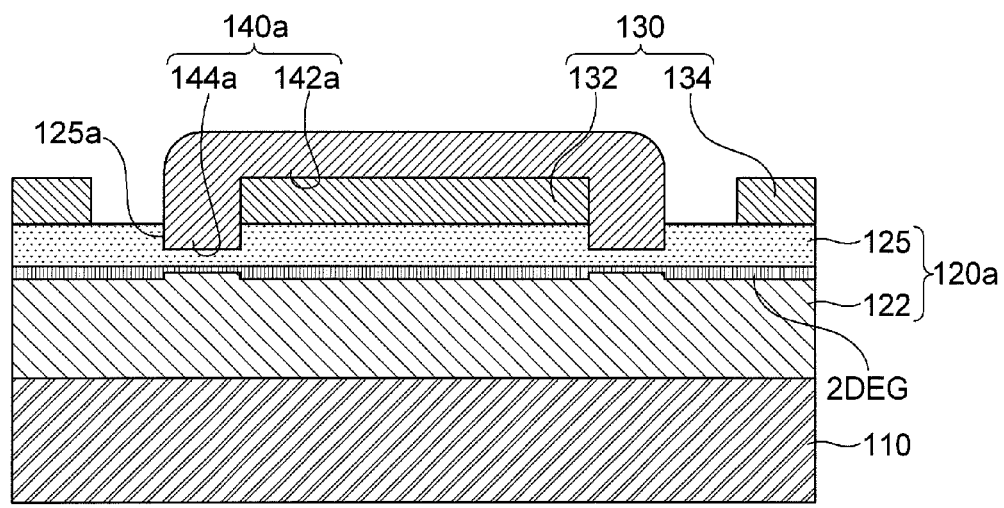
FIG. 6 is a cross-sectional view taken along a line II-II' of FIG. 5.

FIG. 5 is a plane-view showing a modified example of a semiconductor device in accordance with one embodiment of the present invention, and FIG. 6 is a cross-sectional view taken along a line II-II' of FIG. 5.

Referring to FIGS. 5 and 6, the semiconductor device 100a in accordance with one modified embodiment of the present invention may include a base substrate 110, a semiconductor layer 120a, an ohmic electrode part 130, a Schottky electrode part 140a. The semiconductor layer 120a may include the first nitride film 122 and a second nitride film 125 sequentially stacked on the base substrate 110. The first nitride film 122 may include a gallium nitride film, and the second nitride film 125 may include an aluminium gallium nitride film. The 2DEG may be generated on the boundary of the first and second nitride films. The ohmic electrode part 130 may include the first ohmic electrode 132 positioned on a central region of the second nitride film 125, and second ohmic electrode 134 having a ring shape surrounding the first ohmic electrode 132 on edge regions of the second nitride film 125. The Schottky electrode part 140a may be formed to entirely cover the first ohmic electrode 132 on the central region of the second nitride film 125. To this end, a central portion 142a of the Schottky electrode part 140a covers a top surface of the first ohmic electrode 132, edge portions 144a of the Schottky electrode part 140a may cover a part of exposed top surfaces of the second nitride film 125 adjacent to a side surface of the first ohmic electrode 132, and a side surface of the first ohmic electrode 132.

Meanwhile, the edge portions 144a of the Schottky electrode part 140a may be extended to inside of the second nitride film 125. For example, the edge portions 144a may be extended downward from a top part of the second nitride film 124, and may be disposed to be spaced apart from the first nitride film 122. To this end, recesses 125a may be provided in exposed portions of the second nitride film 125 on the middle regions between the first ohmic electrode 132 and the second ohmic electrode 134. The recesses 125a may be formed to have a ring shape along the second nitride film 125 adjacent to a circumference of the first ohmic electrode 132.

Herein, concentration of the 2DEG adjacent to the edge portions 144a may be controlled by controlling depths of the edge portions 144a provided within the second nitride film 125. For example, the deeper the depths of the edge portions 144a (that is, as bottom surfaces of the edge portions 144a become adjacent to the first nitride film 122), the relatively thinner the thickness of the second nitride film 125 adjacent to the first nitride film 122. Thus, the concentration of the 2DEG within the semiconductor layer 120a adjacent to the edge portions 144a may be reduced. On the contrary, the thinner the depths of the edge portions 144a (that is, as the bottom surfaces of the edge portions 144a become far from the first nitride film 122), the relatively thicker the thickness of the second nitride film 125. In this case, the concentration of the 2DEG within the semiconductor layer 120a adjacent to the edge portions 144a may be increased.

The semiconductor device 100a in accordance with one modified embodiment of the present invention may include a Schottky electrode portion 142a having the edge portions 144a extending to inside of the second nitride film 125. In this case, an on-voltage of the semiconductor device 100 can be controlled by controlling the depths of the edge portions 144a extending to inside of the semiconductor layer 120a. Thus, when the edge portions 144a of the Schottky electrode portion 142a is allowed to be deep above a predetermined level, it is possible to reduce the 2DEG of the semiconductor layer 120 adjacent to the edge portions 144a. Further, when the edge portions 144a are allowed to be more deeper, it is possible to remove the 2DEG of the semiconductor layer 120*a* adjacent to the edge portions 144*a*. The semiconductor device 100*a* can reduce a reverse leakage current.

Continuously, a detailed description will be given of a method for manufacturing the semiconductor device 100*a* in accordance with one modified embodiment of the present invention. Herein, the repeated description for the same components between the semiconductor device 100*a* and the above-described semiconductor device will be omitted or simplified.

Figure 7A:
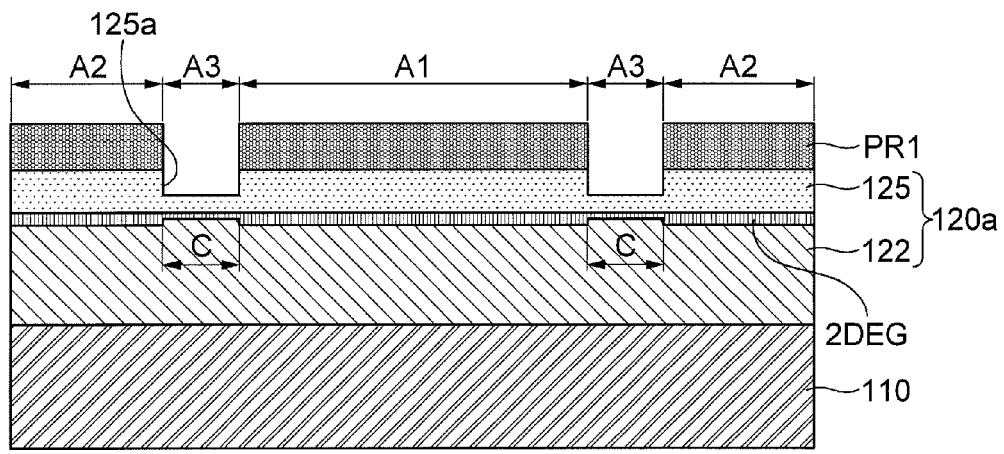
FIGS. 7A to 7C are views showing a method for manufacturing the semiconductor shown in FIGS. 5 and 6.
Figure 7B:
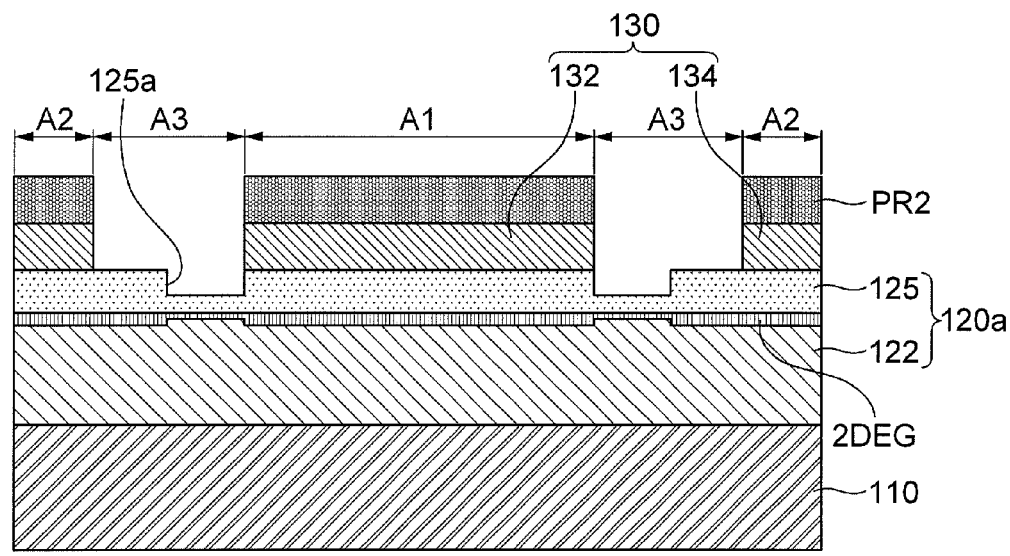
Figure 7C:
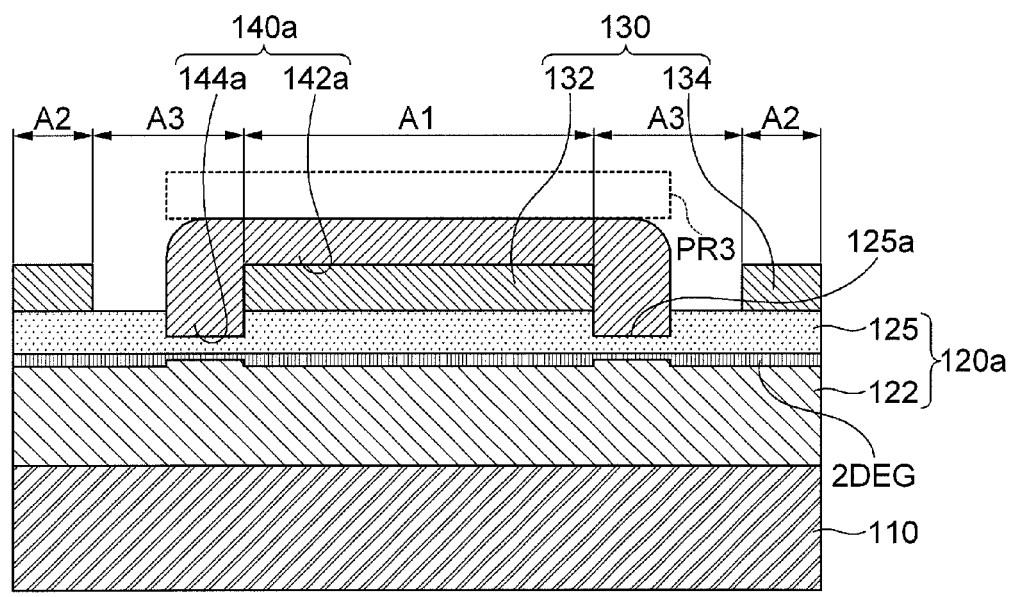

FIGS. 7A to 7C are views showing a method for manufacturing the semiconductor device in accordance with one modified embodiment of the present invention having been described with reference to FIGS. 5 and 6.

Referring to FIG. 7A, the semiconductor device 100 may be prepared. The semiconductor layer 120 may be formed on the base substrate 110. A step of forming the semiconductor layer 120 may include a step of forming the first nitride film 122 and the second nitride film 125 on the semiconductor layer 120 in a sequential manner.

The recesses 125*a* may be formed on the second nitride film 125. For example, the first photoresist pattern PR1 for exposing first middle regions A3 between the central region A1 and the edge regions A2 of the second nitride film 125 may be formed on the second nitride film 125. Then, an etching process for removing an exposed part of the second nitride film 125 by using the first photoresist pattern PR1 as the etching mask. Thus, the recesses 125*a* may be formed on the middle regions A3 of the second nitride film 125. Herein, the concentration of the 2DEG of an internal region C of the semiconductor layer 120*a* adjacent to the recesses 125*a* can be controlled according to the depths of the recesses 125*a*. Therefore, it is possible to perform the etching process in consideration of the concentration of the 2DEG of the internal region C of the semiconductor layer 120*a* adjacent to the recesses 125*a*. After forming the recesses 125*a*, the first photoresist pattern PR1 can be removed.

Referring to FIG. 7B, the ohmic electrode part 130 may be formed on the second nitride film 125. For example, a first metal film for covering a resultant second nitride film 125 may be formed, and a second photoresist pattern PR2 for exposing a part of the first metal film may be formed. In this case, a part of the first metal film exposed by the second photoresist pattern PR2 may be the first metal film on a region which further includes a part of the edge regions A2 together with the middle regions A3. Thereafter, it is possible to perform an etching process of etching the first metal film by using the second photoresist pattern PR2 as an etching mask. Thus, the first ohmic electrode 132 may be formed on the central region A1 stimulously while the second ohmic electrode 134 may be formed on the edge regions A2. In this case, the etching process may be controlled such that no first ohmic electrode 132 can remain on the recesses 125*a*. After the etching process, the second photoresist pattern PR2 may be removed.

Referring to FIG. 7C, the Schottky electrode part 140*a* may be formed. For example, a second metal film for covering a resultant ohmic electrode part 130 may be formed. In this case, the second metal film may be formed on the semiconductor layer 120*a* while being buried in the recesses 125*a* formed on the second nitride film 125 of the semiconductor layer 120*a*. Then, the second metal film on the edge regions A2 may be removed. A step of removing the second metal film on the edge regions A2 may include a step of forming a third photoresist pattern PR3 which exposes the edge regions A2 on the second metal film, and a step of etching the second metal film by using the third photoresist pattern PR3 as an etching mask. Thus, the Schottky electrode part 140*a*, having a structure in which the central portion 142*a* covers the first ohmic electrode 132 and the edge portions 144*a* cover the side surface of the second ohmic electrode 134 and the recesses 125*a*, may be formed on the semiconductor layer 120*a*.

Figure 8:
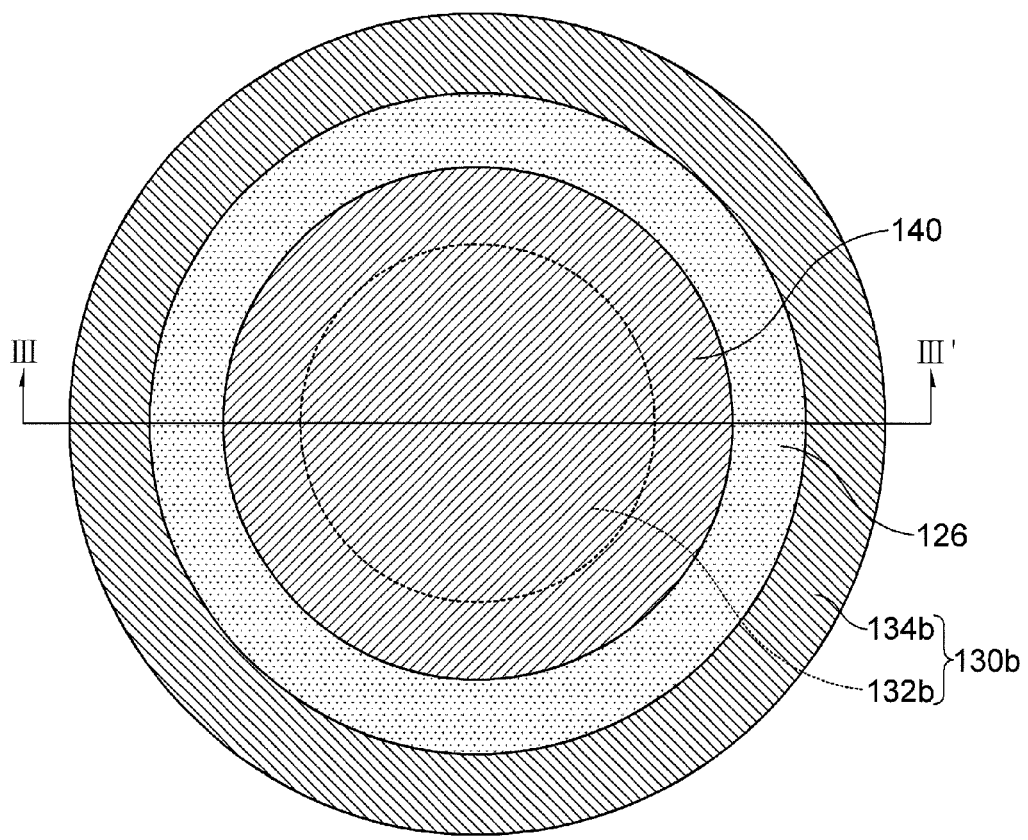
FIG. 8 is a plane-view showing other modified example of a semiconductor device shown in FIGS. 1 and 2.
Figure 9:
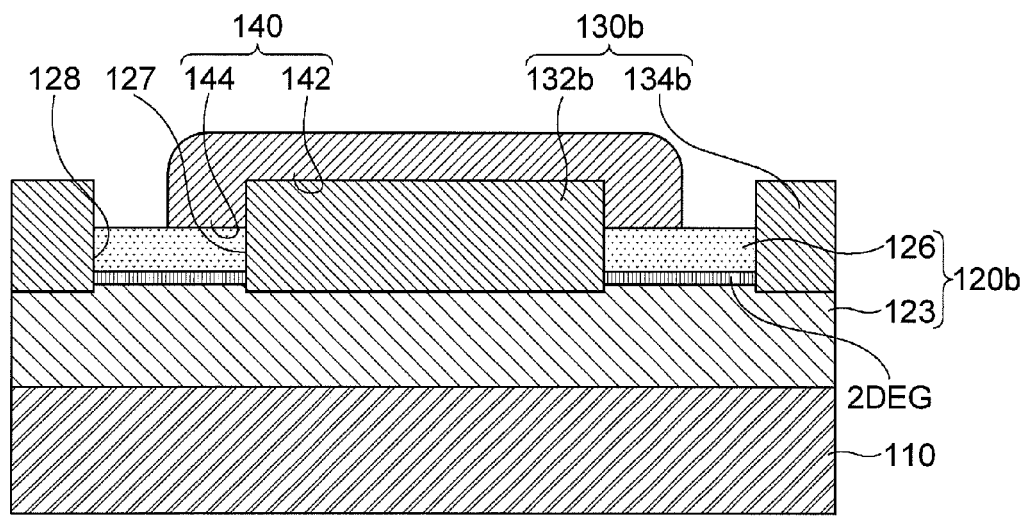
FIG. 9 is a cross-sectional view taken along a line III-III' of FIG. 8.

FIG. 8 is a plane-view showing another modified example of the semiconductor device in accordance with one embodiment of the present invention. FIG. 9 is a cross-sectional view taken along a line III-III' shown in FIG. 8.

Referring to FIGS. 8 and 9, the semiconductor device 100*b* in accordance with another modified embodiment of the present invention may include the base substrate 110, a semiconductor layer 120*b*, an ohmic electrode part 130*b*, and the Schottky electrode part 140.

The semiconductor layer 120*b* may include a first nitride film 123 and a second nitride film 126 sequentially stacked on the semiconductor device 100. A 2DEG may be generated on a boundary between the first and second nitride films. The ohmic electrode part 130*b* may include a first ohmic electrode 132*b*, and second ohmic electrode 134*b*, wherein the first ohmic electrode 132*b* is disposed on the central region of the second nitride film 126, and the second ohmic electrode 134*b* having a ring shape surrounding the first ohmic electrode 132*b* on the edge regions of the second nitride film 126. Then, the Schottky electrode part 140 may be formed to entirely cover the first ohmic electrode 132*b* on the central region of the semiconductor layer 120*b*. For example, the central portion 142 of the Schottky electrode part 140 may cover the top surface of the first ohmic electrode 132*b*, and the edge portions 144 of the Schottky electrode part 140 may cover the side surface of the first ohmic electrode 132*b* and the top surface of the second nitride film 124 adjacent thereto. In this case, the edge portions 144 of the Schottky electrode part 140 may be disposed to be spaced apart from the second ohmic electrode 134*b*.

Meanwhile, the ohmic electrode part 130*b* may be extended to inside of the semiconductor layer 120*b*. For example, the first ohmic electrode 132*b* and the second ohmic electrode 134*b* may be extended to the inside of the first nitride film 123 through the second nitride film 126. In this case, the first ohmic electrode 132*b* and the second ohmic electrode 134*b* may be formed to pass through a location of the 2DEG. To this end, the semiconductor layer 120*b* may have first and second recess 127 and 128 formed therewithin for burring the first ohmic electrode 132*b* and second ohmic electrode 134*b* inside of the semiconductor layer 120*b*.

The first recesses 127 may be a trench in which the first ohmic electrode 132*b* is buried, and the second recess 128 may be a trench in which the second ohmic electrode 134*b* is buried. Although the present embodiment has been illustrated taking an example where the first recesses 127 has the same depth as that of the second recess 128, depths of the first and second recess 127 and 128 may be selectively differed from each other. In the semiconductor device 100*b*, a current may flow only in a horizontal direction between the first ohmic electrode 132*b* and the second ohmic electrode 134*b*.

The semiconductor device 100*b* having the above-described structure can control the concentration of the 2DEG generated on the semiconductor layer 120*b* by controlling a depth at which the ohmic electrode part 130*b* is formed inside of the semiconductor layer 120*b*.

Figure 10A:
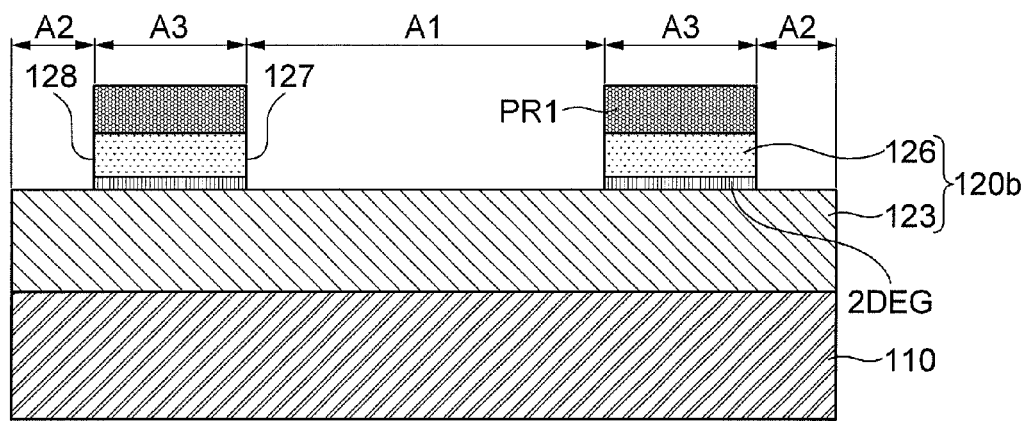
FIGS. 10A to 10C are views showing a method for manufacturing the semiconductor shown in FIGS. 8 and 9.
Figure 10B:
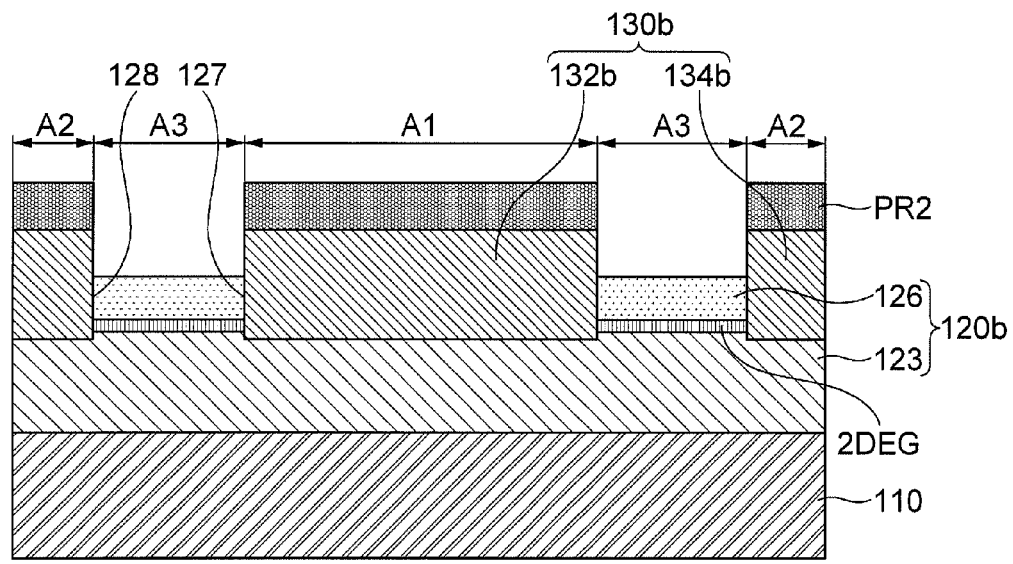
Figure 10C:
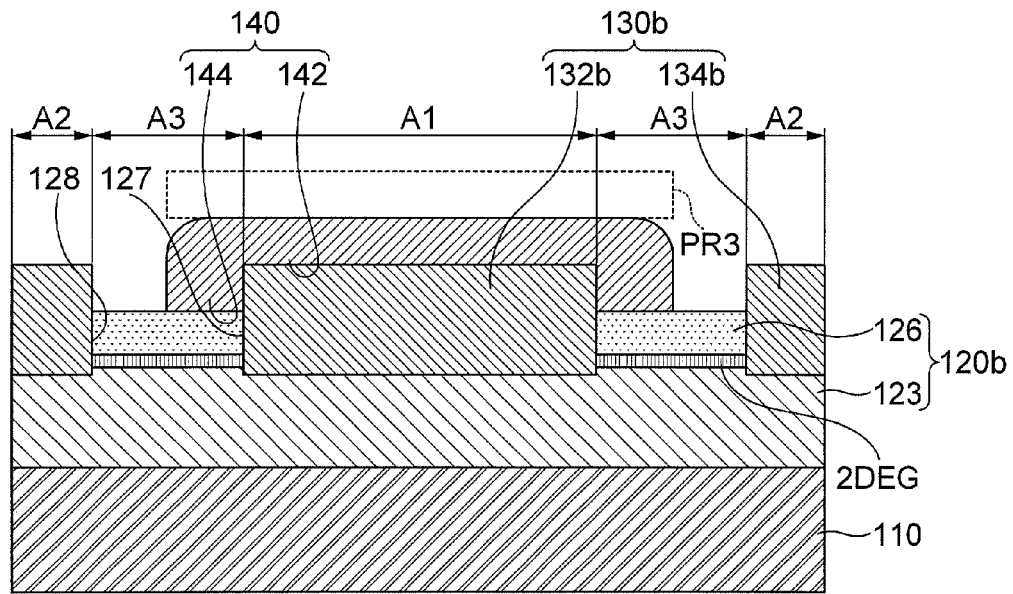

Continuously, a detailed description will be given of a method for manufacturing the semiconductor device 100*b* in accordance with another modified embodiment of the present invention. FIGS. 10A to 10C are views showing a method for manufacturing the semiconductor device 100b having been described with reference to FIGS. 8 and 9.

Referring to FIG. 10, the base substrate 110 may be prepared, and the first nitride film 123 and the second nitride film 126 may be sequentially formed on the base substrate 110. The first nitride film 123 may include a gallium nitride film, and the second nitride film 126 may include an aluminum gallium nitride film. The first recesses 127 and the second recess 128 may be formed on the second nitride film 126. For example, it is possible to perform an etching process for etching the semiconductor layer 120b by using the resultant PR1 as an etching mask after the first photoresist pattern PR1 exposing the central region A1 and the edge regions A2 of the semiconductor layer 120b is formed on the second nitride film 126. For example, in the etching process, depths of the first recesses 127 and the second recess 128 pass through the second nitride film 126 such that the depths can be controlled to be extended to the inside of the first nitride film 123. After the etching process is performed, the first photoresist pattern PR1 may be removed. Herein, the concentration of the 2DEG of the internal region C of the semiconductor layer 120b adjacent to the first and second recess 127 and 128 can be controlled according to the depths of the first and second recess 127 and 128. Therefore, it is possible to perform the etching process in consideration of the concentration of the 2DEG in the internal region C of the semiconductor layer 120b adjacent to the first and second recess 127 and 128.

Referring to FIG. 10B, it is possible to form the ohmic electrode part 130b. For example, it is possible to form a first metal film which covers a resultant second nitride film 126 having the first and second recess 127 and 128. Herein, the first metal film may be formed while being burred in the first and second recess 127 and 128. It is possible to form the second photoresist pattern PR2, which exposes the first metal film on the middle region A3 between the central region A1 and the edge regions A2, on the first metal film. It is possible to etch the first metal film by using the second photoresist pattern PR2 as the etching mask. Thus, the first ohmic electrode 132b may be formed on the central region A1 of the semiconductor layer 120b, and the second ohmic electrode 134b may be formed on the edge regions A2 of the semiconductor layer 120b.

Referring to FIG. 10C, it is possible to form the Schottky electrode part 140. For example, the second metal film may be formed on a resultant ohmic electrode part 130b. The second metal film may be a film composed of a metallic material different from that of the first metal film, for formation of the ohmic electrode part 130b. A third photoresist pattern PR3 which exposes a part of the edge regions A2 and the middle region A3 may be formed on the second metal film, and the second metal film may be etched by using the resultant third photoresist pattern PR3 as the etching mask. Thus, the Schottky electrode part 140, which entirely covers the first ohmic electrode 132b, may be formed on the central region A1 of the semiconductor layer 120.

Figure 11:
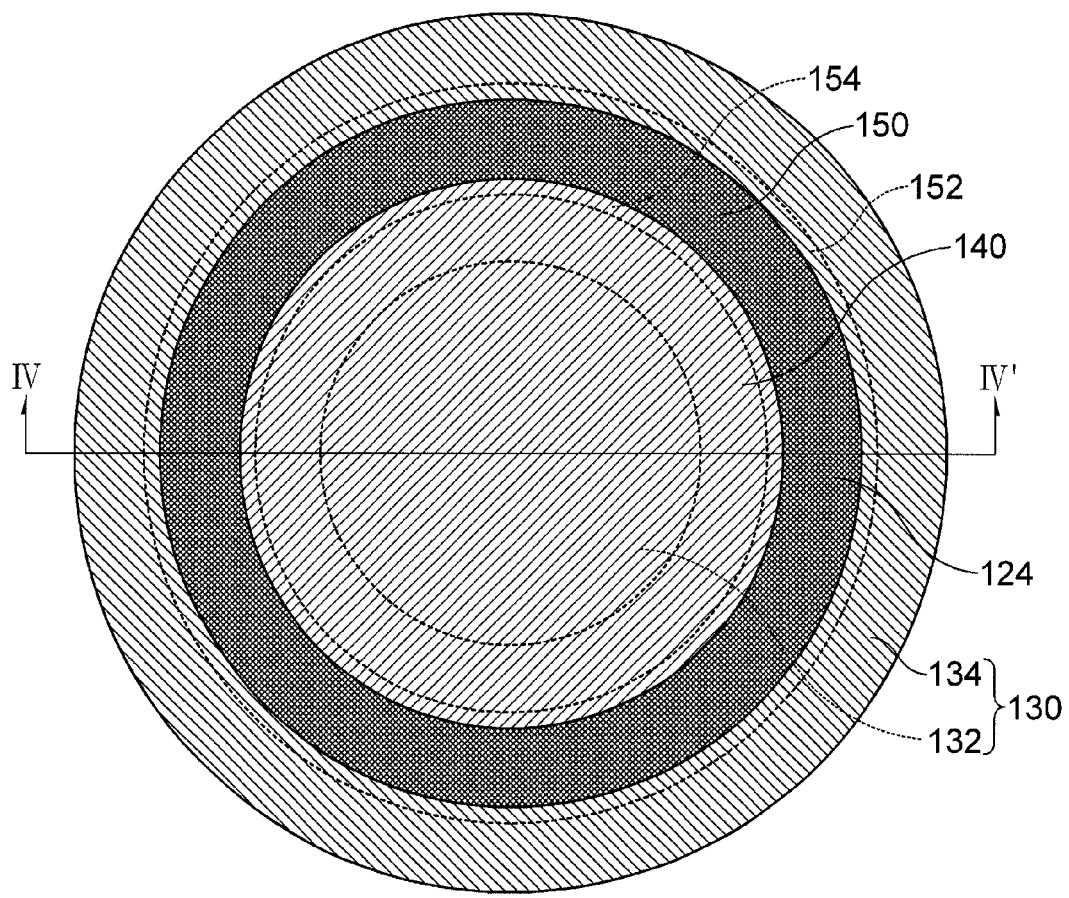
FIG. 11 is a plane-view showing other modified example of a semiconductor device shown in FIGS. 1 and 2.
Figure 12:
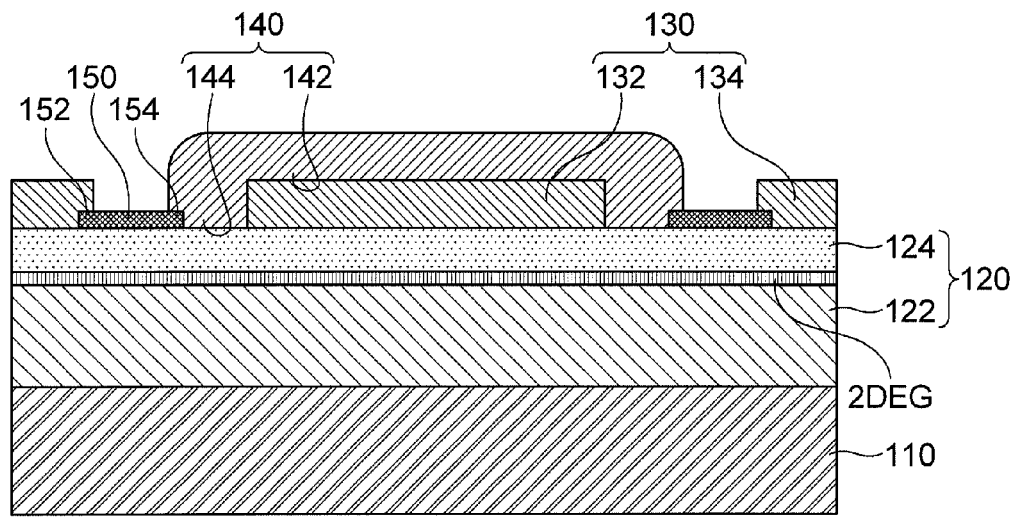
FIG. 12 is a cross-sectional view taken along a line IV-IV' of FIG. 11.

FIG. 11 is a plane-view showing another modified example of the semiconductor device in accordance with an embodiment of the present invention. FIG. 12 is a cross-sectional view taken along a line IV-IV' shown in FIG. 11.

Referring to FIGS. 11 and 12, the semiconductor device 100c in accordance with another modified embodiment of the present invention may include a base substrate 110, a semiconductor layer 120, an ohmic electrode part 130, a Schottky electrode part 142, and a field plate 150. The semiconductor layer 120 may include a first nitride film 122 and a second nitride film 124 sequentially stacked on the base substrate 110. A 2DEG may be generated on a boundary of the first and second nitride films. The ohmic electrode part 130 may include a first ohmic electrode 132 and second ohmic electrode 134. The first ohmic electrode 132 may be disposed on a central region of the second nitride film 124. The second ohmic electrode 134 has with a ring shape surrounding the first ohmic electrode 132 on the edge regions of the second nitride film 124. The Schottky electrode part 142 may be formed to entirely cover the first ohmic electrode 132 on the central region of the second nitride film 124. To this end, a central portion 142 of the Schottky electrode part 140 covers a top surface of the first ohmic electrode 132, edge portions 144 of the Schottky electrode part 140 may cover a side surface of the first ohmic electrode 132 and a part of exposed top surfaces of the second nitride film 124 adjacent thereto.

Meanwhile, the field plate 150 may be disposed on the semiconductor layer 120 between the second ohmic electrode 134 and the Schottky electrode part 142. In this case, external side portion 152 of the field plate 150 may be provided to be partially covered by the second ohmic electrode 134, and an internal side portion 154 of the field plate 150 may be provided to be partially covered by the edge portions 144a of the Schottky electrode part 140. The field plate 150 can provide an effect of distributing an electric field concentrated on a corner portion of the Schottky electrode part 142 and the ohmic electrode part 130.

Figure 13A:
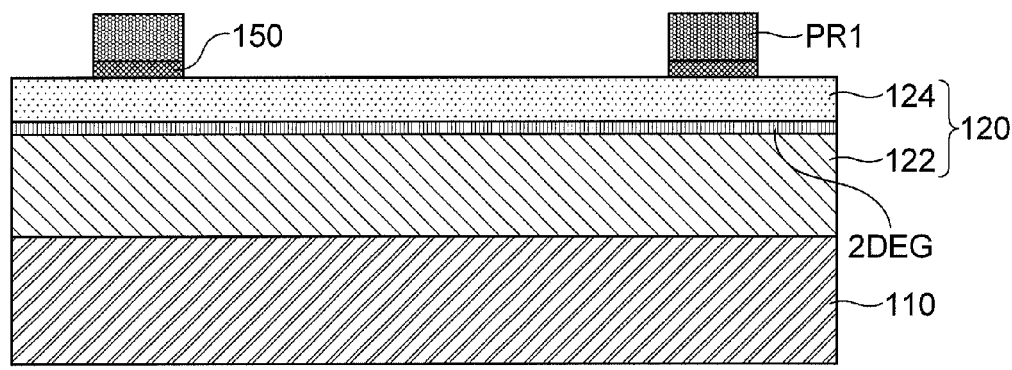
FIGS. 13A to 13C are views showing a method for manufacturing the semiconductor shown in FIGS. 11 and 12.
Figure 13B:
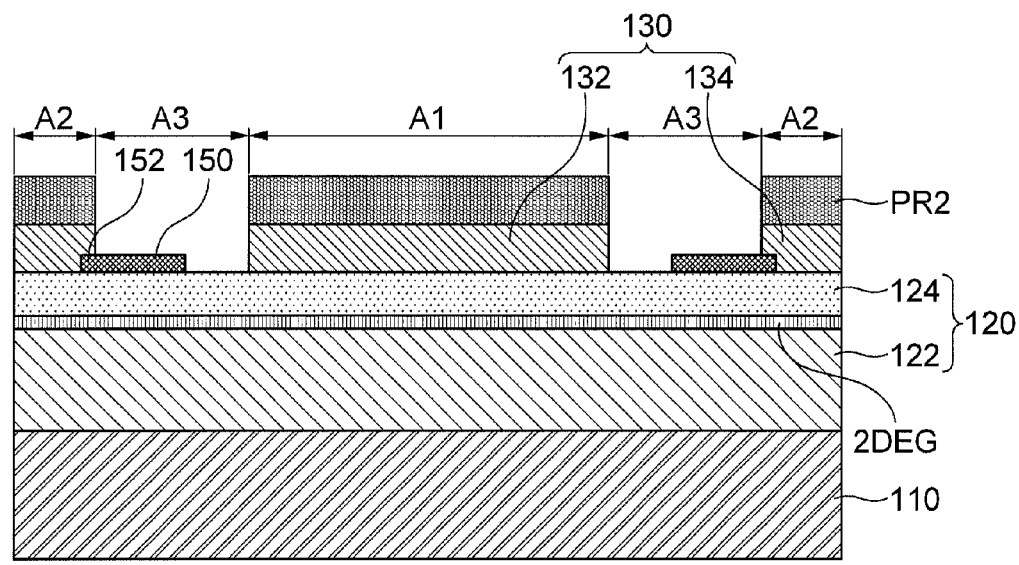
Figure 13C:
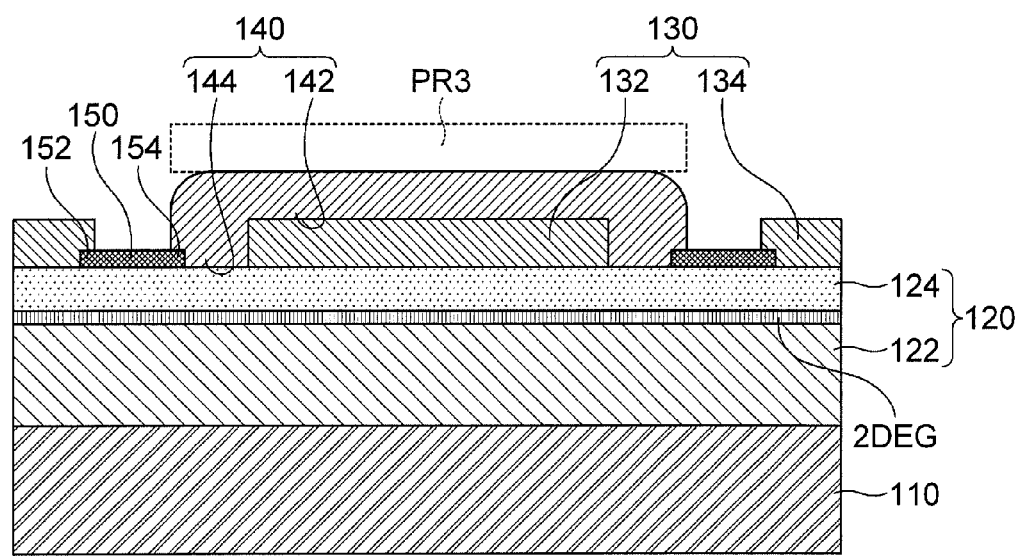

Continuously, a detailed description will be given of a method for manufacturing a semiconductor device 100c in accordance with another modified embodiment of the present invention. FIGS. 13A to 13C are views showing methods for manufacturing a semiconductor device 100c having been described with reference to FIGS. 11 and 12, respectively.

Referring to FIG. 13A, the base substrate 110 may be prepared, and the first nitride film 122 and the second nitride film 124 may be sequentially formed on the base substrate 110. The first nitride film 122 may include a gallium nitride, and the second nitride film 124 may include an aluminium gallium nitride.

The field plate 150 may be formed. A step of forming the field plate 150 may include a step of forming an insulating film on the second nitride film 124 in a conformal manner, a step of forming the first photoresist pattern PR1 which exposes a central region and edge regions of the insulating film, on the insulating film, and a step of etching the insulating film by using the first photoresist pattern PR1 as an etching mask. Thus, the field plate 150 disposed between the central region and the edge regions of the semiconductor layer 120 may be formed on the semiconductor layer 120. After the field plate 150 is formed, the first photoresist pattern PR1 may be removed.

Referring to FIG. 13B, the ohmic electrode part 130 may be formed. For example, the first metal film may be formed that entirely covers a resultant field plate 150. Then, the second photoresist pattern PR2 may be formed on the first metal film. The second photoresist pattern PR2 can expose the first metal film on the middle regions A3 between the central region A1 and the edge regions A2. In addition, the second photoresist pattern PR2 may be provided such that the first metal film on the external side portion 152 of the field plate 150 fails to be exposed. Thereafter, it is possible to etch the first metal film by using the second photoresist pattern PR2 as an etching mask. Thus, the first ohmic electrode 132 may be formed on the central region A1 of the semiconductor layer 120, and the second ohmic electrode 134 may be formed on the edge regions A2 of the semiconductor layer 120. Herein, the second ohmic electrode 134 may be formed to partially cover the external side portion 152 of the field plate 150. In this case, it is possible to distribute an electric field concentrated on the corner portion of the second ohmic electrode 134 which comes into contact with the field plate 150.

Referring to FIG. 13C, the Schottky electrode part 140 may be formed. For example, the second metal film may be formed on the resultant ohmic electrode part 130. The second metal film may be a film of a metallic material different from that of the first metal film, for formation of the ohmic electrode part 130. It is possible to form the third photoresist pattern PR3 which exposes a part of the edge regions A2 and the middle regions A3 on the second metal film. In addition, the third photoresist pattern PR3 may be provided such that the second metal film on the internal side portion 154 of the field plate 150 fails to be exposed. Thereafter, it is possible to etch the second metal film by using the third photoresist pattern PR3 as an etching mask. Thus, it is possible to form the Schottky electrode part 142 which entirely covers the first ohmic electrode 132b on the central region A1 of the semiconductor layer 120. Herein, the Schottky electrode part 142 may be formed to partially cover the internal side portion 154 of the external side portion 152. In this case, it is possible to distribute an electric field concentrated on an edge portion of the Schottky electrode part 140 which comes into contact with the field plate 150.

Hereinafter, a detailed description will be given of a method for manufacturing the semiconductor device in accordance with other embodiments of the present invention with referent to accompanying drawings.

Figure 14:
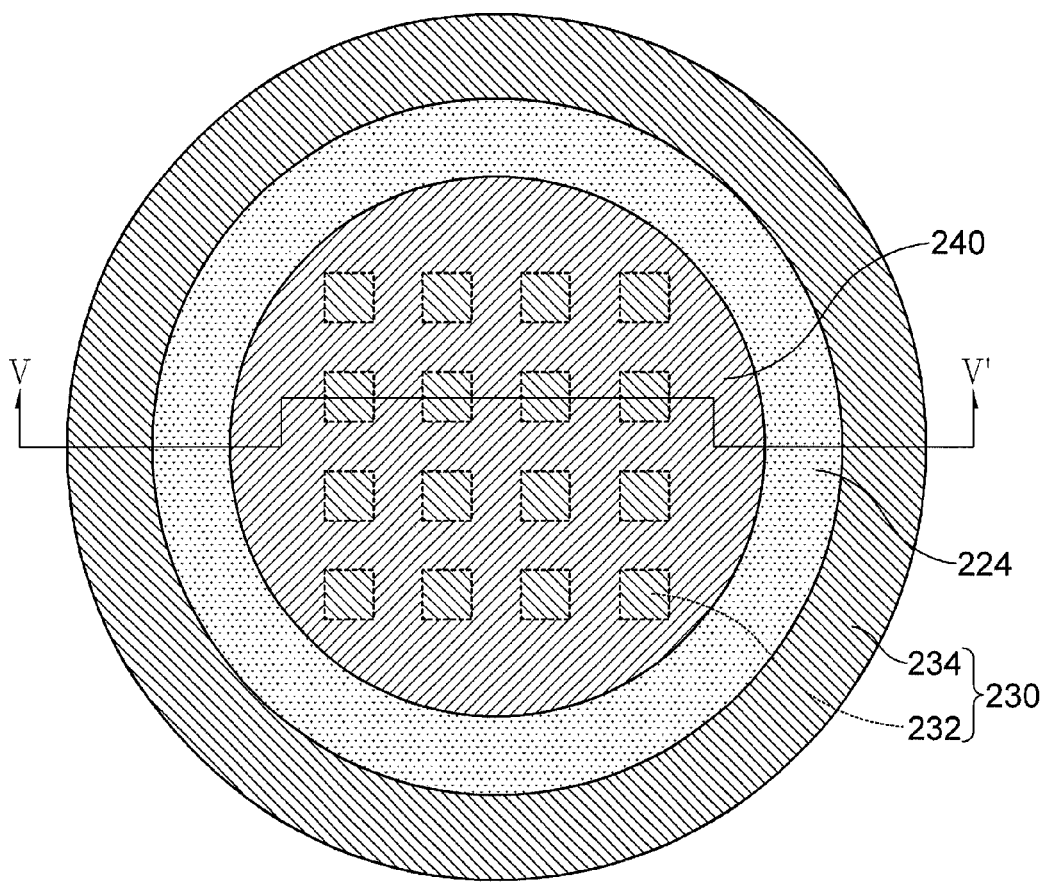
FIG. 14 is a plane-view showing other modified example of a semiconductor device shown in accordance with other embodiment of the present invention.
Figure 15:
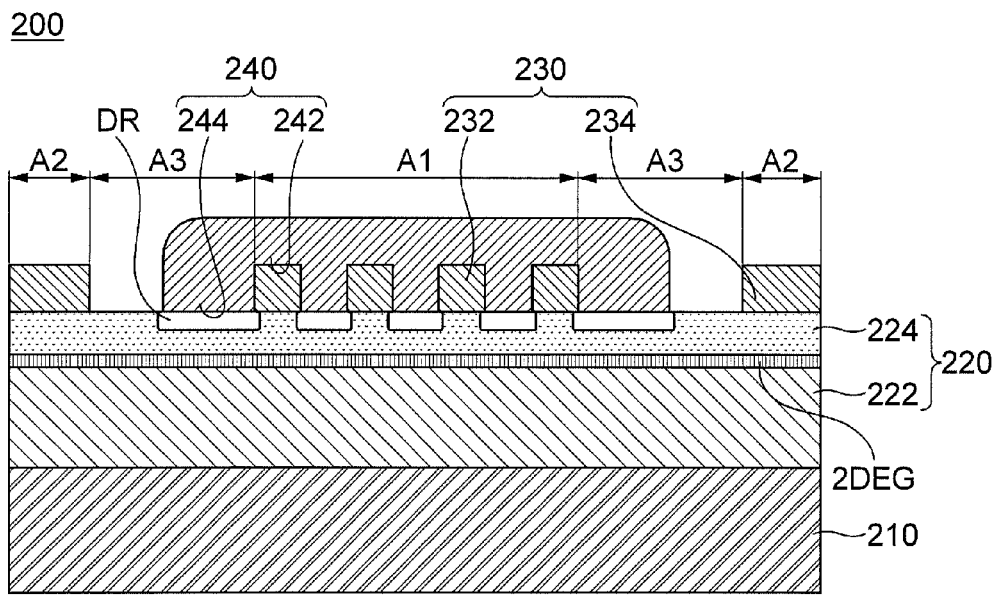
FIG. 15 is a cross-sectional view taken along a line V-V' of FIG. 14.

FIG. 14 is a view showing a semiconductor device in accordance with other embodiments of the present invention, and FIG. 15 is a cross-sectional view taken along a line V-V' of FIG. 14.

Referring to FIGS. 14 and 15, a semiconductor device 200 in accordance with other embodiment of the present invention may include a base substrate 210, a semiconductor layer 220, an ohmic electrode part 230, and a Schottky electrode part 240.

The base substrate 210 may be a plate for formation of the semiconductor device having the Schottky diode structure. For example, the base substrate 210 may be a semiconductor substrate. The base substrate 210 may correspond to at least one of a silicon substrate, a silicon carbide substrate, and a sapphire substrate.

The semiconductor layer 220 may be disposed on the base substrate 210. For example, the semiconductor layer 220 may include a first nitride film 222 and a second nitride film 224 which are sequentially stacked on the base substrate 210. The second nitride film 224 may be formed of a material having an energy band gap wider than that of the first nitride film 222. In addition, the second nitride film 224 may be formed of a material having a lattice parameter different from that of the first nitride film 222. For example, the first nitride film 222 and the second nitride film 224 may be films which contain a III-nitride-based material. In particular, the first nitride film 222 and the second nitride film 224 may be formed of any one of GaN, AlGaN, InGaN, and InAlGaN. For example, the first nitride film 222 may be a gallium nitride film, and the second nitride film 224 may be an aluminium gallium nitride film. Herein, the first nitride film 222 of the semiconductor layer 220 is formed of P-type GaN having high resistivity, thereby reducing a leakage current of the semiconductor device 200.

The semiconductor layer 220 may be provided with 2-Dimensional Electron Gas (2DEG) on a boundary of the first nitride film 222 and the second nitride film 224. When the semiconductor device 200 is operated, a current flows through the 2DEG. Meanwhile, a buffering film (not shown) may be further formed between the base substrate 210 and the first nitride film 222 so as to solve problems caused by lattice mismatch between the base substrate 210 and the first nitride film 222.

The ohmic electrode part 230 may be disposed on the second nitride film 224. For example, the ohmic electrode part 230 may include first ohmic electrodes 232 and a second ohmic electrode 234. The first ohmic electrodes 232 may be disposed on a central region A1 of the second nitride film 224. Each of the first ohmic electrodes 232 may have a island-shaped cross section. For example, each of the first ohmic electrodes 232 may have a rectangular-shaped cross section. The first ohmic electrodes 232 may be disposed to be spaced apart from one another at a predetermined space. The first ohmic electrodes 232 may be disposed to be in a grid configuration on the central region A1.

The second ohmic electrode 234 may be formed along the edge regions A2 of the second nitride film 224. The second ohmic electrode 234 may be disposed on edge regions A2 of the second nitride film 224 to surround the first ohmic electrodes 232. Thus, the second ohmic electrode 234 may be mainly formed in a ring shape. Also, the second ohmic electrode 234 may be disposed to be spaced apart from the first ohmic electrodes 232 at a predetermined space.

The Schottky electrode part 240 may be provided to cover the first ohmic electrodes 232. For example, the Schottky electrode part 240 may be provided on the central region A1 of the second nitride film 224 so that it can entirely cover the first ohmic electrodes 232. Thus, the Schottky electrode part 240 and the first ohmic electrodes 232 have a prominence and depression structure in which they are engaged with each other up and down. The Schottky electrode part 240 may have a first bonding portions 242 bonded to the first ohmic electrodes 232, and a second bonding portion 244 bonded to a top surface of the semiconductor layer 220 adjacent to the first ohmic electrodes 232.

In the semiconductor device 200 having the above-described structure, each of the first ohmic electrodes 232 may be bonded to the second nitride film 224 on the central region A1 to thereby achieve an ohmic contact, the second ohmic electrode 234 may be bonded to the second nitride film 224 on the central region A1 to thereby achieve an ohmic contact. The Schottky electrode part 240 may be bonded to the first ohmic electrodes 232 and the second nitride film 224 on the central region A1 to thereby achieve an ohmic contact. Also, the Schottky electrode part 240 may be used as an anode electrode, and the second ohmic electrode 234 may be used as a cathode electrode.

Meanwhile, the ohmic electrode part 230 and the Schottky electrode part 240 may be formed of various materials. For example, the first ohmic electrodes 232 and the second ohmic electrode 234 may be formed of the same metallic material, and the Schottky electrode part 240 may be formed of a metallic material different from that of the first and second ohmic electrodes 232 and 234. For example, the first and second ohmic electrodes 232 and 234 may be formed of a metallic material composed of at least one of Al, Mo, Au, Ni, Pt, Ti, Pd, Ir, Rh, Co, W, Ta, Cu, Zn. On the contrary, the Schottky electrode part 240 may be formed of a material composed of one or more metal elements different from those of the ohmic electrode part 230.

Continuously, a detailed description will be given of various operation states of the semiconductor device 200 in, accordance with an embodiment of the present invention with reference to FIGS. 14 and 15.

Figure 16A:
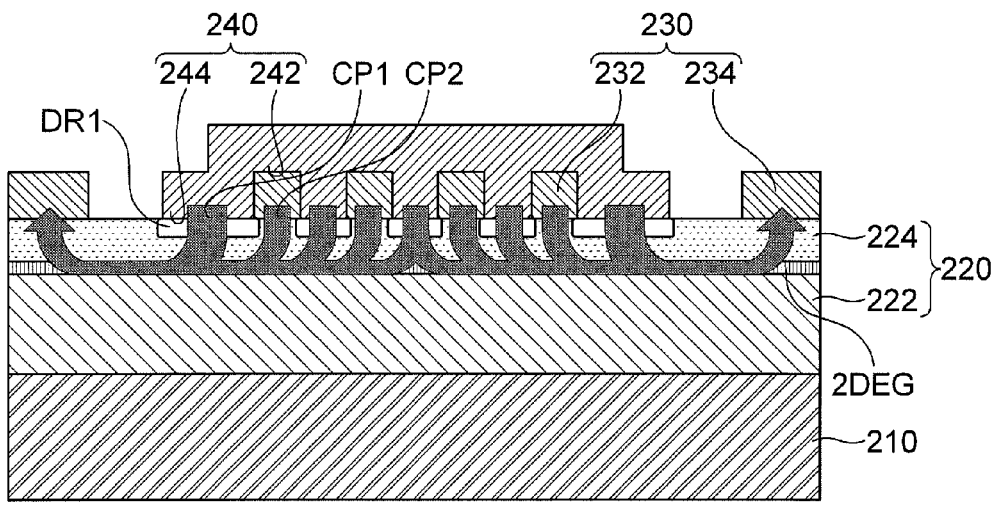
FIGS. 16A to 16C are, views showing a method for manufacturing the semiconductor shown in FIG. 14.
Figure 16B:
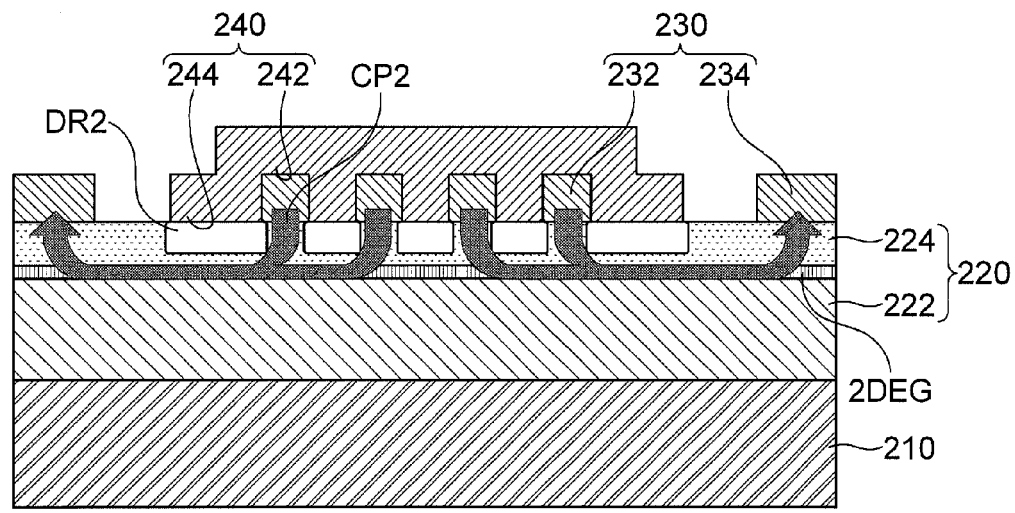
Figure 16C:
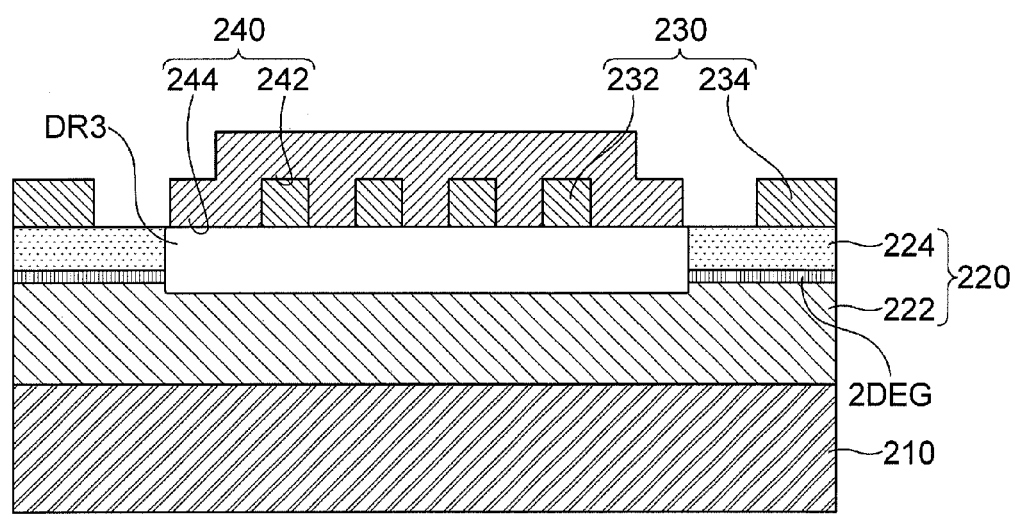

FIGS. 16A to 16C are views showing operation states of the semiconductor device shown in FIG. 15, respectively. FIG. 16A is a view showing an operation state of the semiconductor device when driven at a forward voltage equal to or higher than an on-voltage of the Schottky diode. Referring to FIG. 16A, when the semiconductor device 200 in accordance with another embodiment of the present invention is driven at a first forward voltage equal to or higher than the on-voltage of the Schottky diode, a depletion region (DR1) generated where the second semiconductor layer 220 and the Schottky electrode part 240 are joined together may be relatively reduced. Thus, a current may flow through a first current path CP1 and a second current path CP2, wherein the first current path CP1 passes through the 2DEG from the first ohmic electrodes 232, and the second current path CP2 passes through the 2DEG from the Schottky electrode part 240. In this case, since forward currents of the semiconductor device 200 is increased, it is possible to operate the semiconductor device 200 even at a low on-voltage.

FIG. 16B is a view showing an operation state of the semiconductor device when driven at a forward voltage lower than an on-voltage of the Schottky diode. Referring to FIG. 16B, when the semiconductor device 200 in accordance with one embodiment of the present invention is driven at a second forward voltage lower than the on-voltage the Schottky diode, a depletion region DR2 generated where the second semiconductor layer 220 and the Schottky electrode part 240 are joined together may be more expanded than the depletion region DR1 corresponding to a case where the semiconductor device 200 is driven at the first forward voltage as described in FIG. 16A. Such the expanded DR2 may be wide enough to block a current flow between the second nitride film 224 and the Schottky electrode part 240. However, the second forward voltage may be controlled such that the depletion region DR2 fails to be expanded to the 2DEG. Thus, in the semiconductor device 200, a current may flow through the second current path CP2 alone.

FIG. 16C is a view showing an operation state of the semiconductor device when driven at a reverse voltage. Referring to FIG. 16C, when the semiconductor device 200 is driven at the reverse voltage, a depletion region DR3 may be more expanded to the 2DEG than the depletion region DR2 shown in FIG. 16B. The depletion region DR3 allows the 2DEG to be disconnected, thereby blocking all current flows passing through the first current path CP1 and the second current path CP2.

As described above, when the semiconductor device 200 is driven in the forward direction, a current may flow by the first ohmic electrodes 232 positioned below the Schottky electrode part 240 even in a state where the driving voltage is lower than the on-voltage of the Schottky diode, simultaneously while the current may flow through the first ohmic electrodes 232 and the Schottky electrode part 240 in a state where the driving voltage is higher than the on-voltage of the Schottky diode. Thus, since the semiconductor device 200 may increase forward currents, it can be operated even at a low driving voltage. Also, when the semiconductor device 200 is driven in the reverse direction, it is possible to stably block a current flow by disconnecting the 2DEG through the depletion region DR3 which is generated by the Schottky electrode part 240.

Hereinafter, a description will be given of a method for manufacturing the semiconductor device in accordance with other embodiment of the present invention. Herein, the repeated description for the semiconductor device will be omitted or simplified.

Figure 17A:
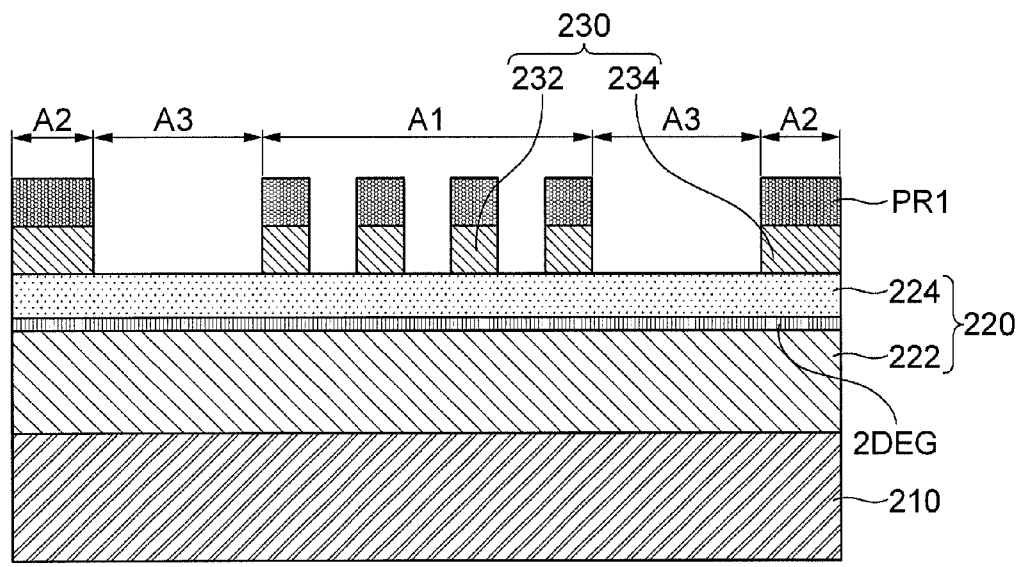
FIGS. 17A to 17C are views showing other modified example of a semiconductor device shown in accordance with other embodiment of the present invention.
Figure 17B:
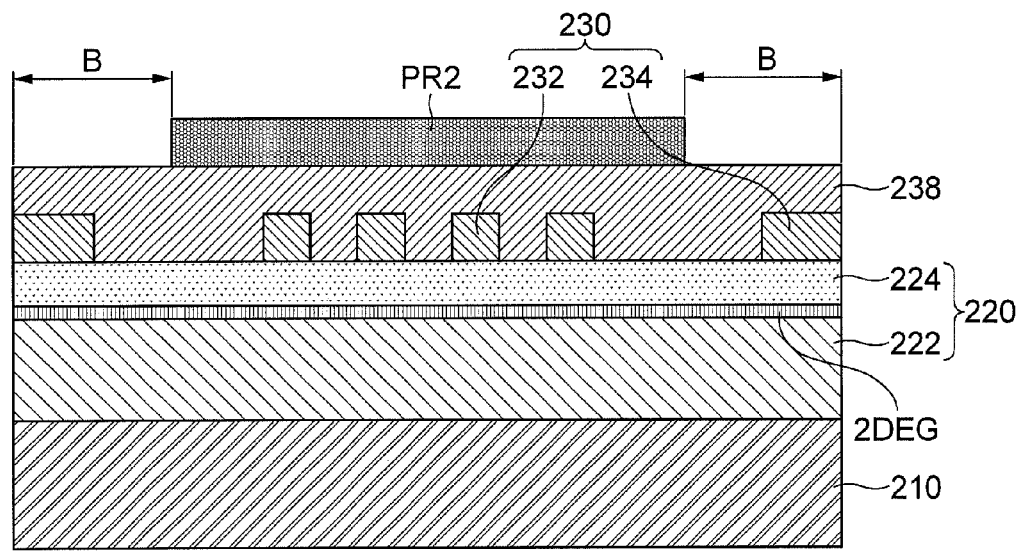
Figure 17C:
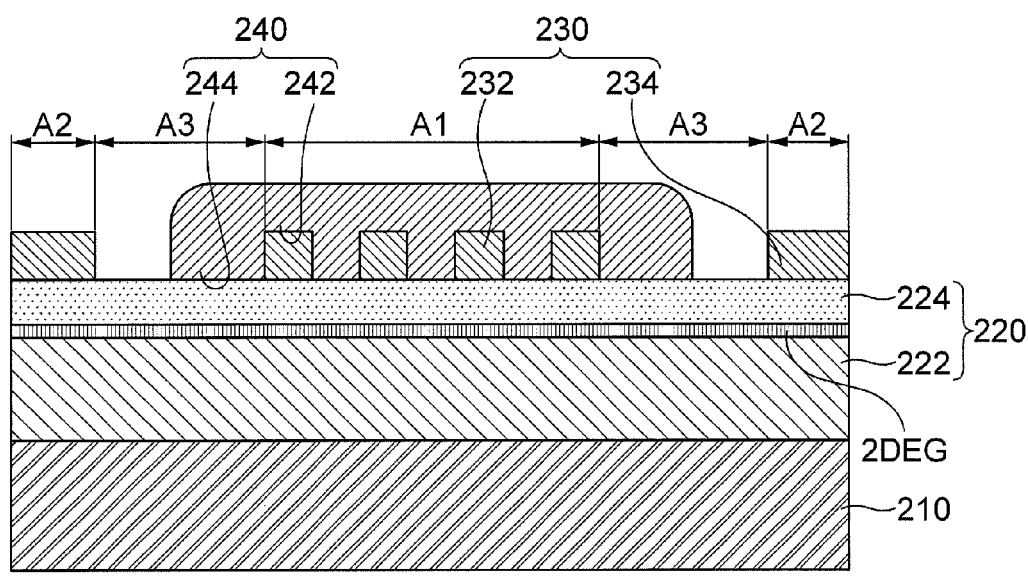

FIGS. 17A to 17C are views showing methods for manufacturing the semiconductor device in accordance with one embodiment of the present invention, respectively.

Referring to FIG. 17A, the base substrate 210 may be prepared. A step of preparing the base substrate 210 may include a step of preparing a semiconductor substrate. The step of preparing the base substrate 210 may include a step of preparing at least one of a silicon substrate, a silicon carbide substrate, and a sapphire substrate.

The semiconductor layer 220 may be formed on the base substrate 210. A step of forming the semiconductor layer 220 may include a step of forming the first nitride film 222 on the base substrate 210, and a step of forming the second nitride film 224 on the first nitride film 222. For example, the step of forming the semiconductor layer 220 may be achieved by epitaxial-growing the first nitride film 222 by using the base substrate 210 as a seed layer, and then epitaxial-growing the second nitride film 224 by using the epitaxial-grown first nitride film 222 as a seed layer. As for an epitaxial growth process for forming the first and second nitride films 222 and 224, at least one of a molecular beam epitaxial growth process, an atomic layer epitaxial growth process, a flow modulation organometallic vapor phase epitaxial growth process, a flow modulation organometallic vapor phase epitaxial growth process, and a hybrid vapor phase epitaxial growth process may be used. Furthermore, as for another process for forming the first and second nitride films 222 and 224, at least one of a chemical vapor deposition process and a physical vapor deposition process may be used.

The ohmic electrode part 230 may be formed on the semiconductor layer 220. For example, a first metal film may be formed on the second nitride film 224. A step of forming the first metal film may include a step of forming a metal film, which is composed of at least one of Au, Ni, Pt, Ti, Al, Pd, Ir, Rh, Co, W, Mo, Ta, Cu, and Zn, on the second nitride film 224 in a conformal manner. Thereafter, a first photoresist pattern PR1 may be formed on the first metal film. The step of forming the first photoresist pattern PR1 may include a step of forming the first photoresist pattern PR1 on the first metal film, and then removing a part of the first photoresist pattern PR1 so that the first metal film on a region, excluding the edge regions A2 and regions where the first ohmic electrodes 232 shown in FIG. 17 are to be formed, can be exposed. Then, it is possible to remove the first photoresist pattern PR1 after etching the first metal film by using the first photoresist pattern PR1 as an etching mask. Thus, a plurality of first ohmic electrodes 232 disposed to be in a lattice configuration on the central region A1 and the second ohmic electrode 234 having the ring-shape formed along the edge regions A2 may be formed on the second nitride film 224. Herein, since the first ohmic electrodes 232 and the second ohmic electrode 234 are simultaneously formed in the same etching process, they may be formed of the same metallic material. For example, the first ohmic electrodes 232 and the second ohmic electrode 234 may be formed in an in-situ scheme at the same time. Meanwhile, a process of planarizing the first metal film may be added before the first metal film is etched.

Referring to FIG. 17B, a second metal film 238 for covering all surfaces of the resultant ohmic electrode part 230 may be formed. The second metal film 238 may be formed of a metallic film different from that of the ohmic electrode part 230. Thereafter, the second photoresist pattern PR2 for exposing edge regions B of the second metal film 238 may be formed on the second metal film 238. Herein, the edge regions B of the second metal film 238 may be a region including a part of the middle regions A3 and all of the edge regions A2 of the second ohmic electrode 234 of FIG. 17A.

Referring to FIG. 17C, a second photoresist pattern indicated by reference numeral PR2 of FIG. 17B is used as an etching mask for etching the second metal film 238. Thus, the Schottky electrode part 240 for entirely covering the first ohmic electrodes 232 may be formed on the second nitride film 224. Therefore, the Schottky electrode part 240 and the first ohmic electrodes 232 are configured to be in prominence and depression structure, in which they are engaged with each other, on the central region A1 up and down. Herein, the Schottky electrode part 240 may be disposed to be spaced apart from the second ohmic electrode 234. Thus, the region of the second nitride film 224 between the first ohmic electrodes 232 and the second ohmic electrode 234 may be exposed. By removing the second photoresist pattern PR2, it is possible to form the semiconductor device 200 as shown in FIGS. 15 and 16.

Hereinafter, a description will be given of various modified examples of the semiconductor device in accordance with other embodiment of the present invention. The repeated description for the same components between the above-described semiconductor device and semiconductor devices in accordance with various modified embodiments will be omitted or simplified. Since those skilled in the art can analogize operation processes of the modified examples to be described from the operation states of the semiconductor device having been described with reference to FIGS. 16A to 16C, the description for operation processes of the modified examples will be omitted.

Figure 18:
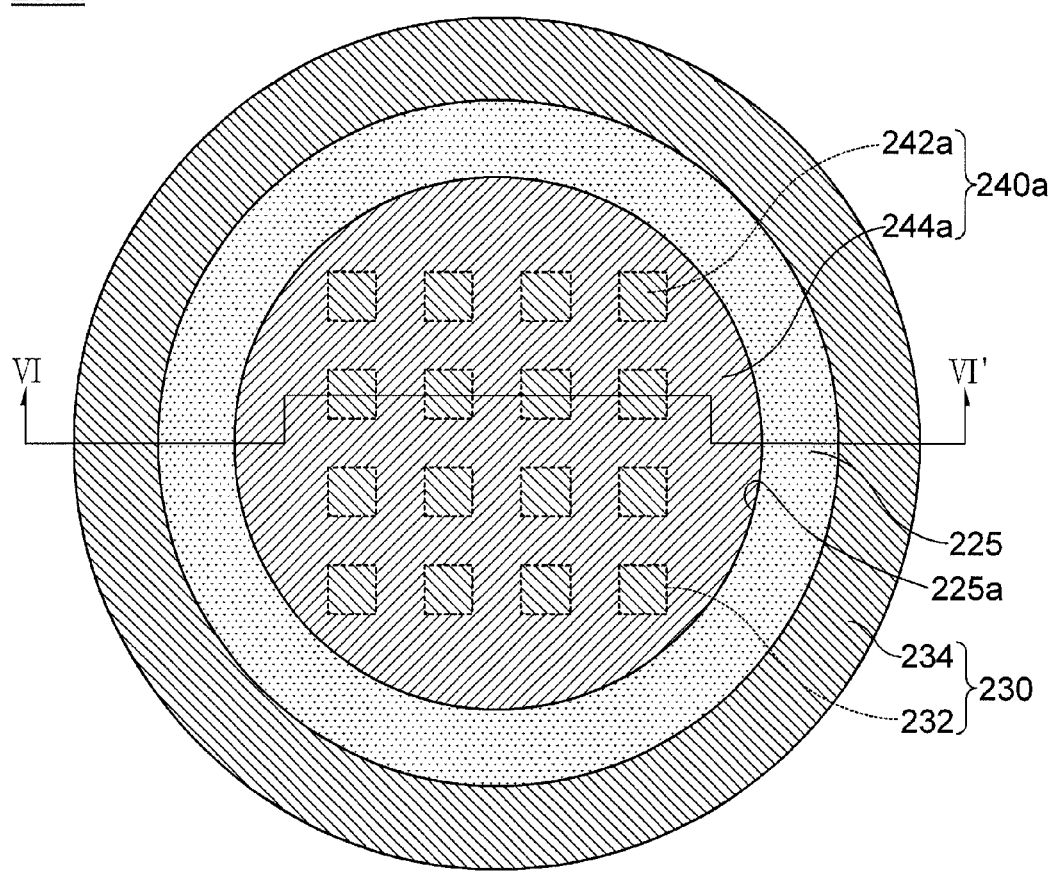
FIG. 18 is a plane-view showing other modified example of a semiconductor device shown in accordance with other embodiment of the present invention.
Figure 19:
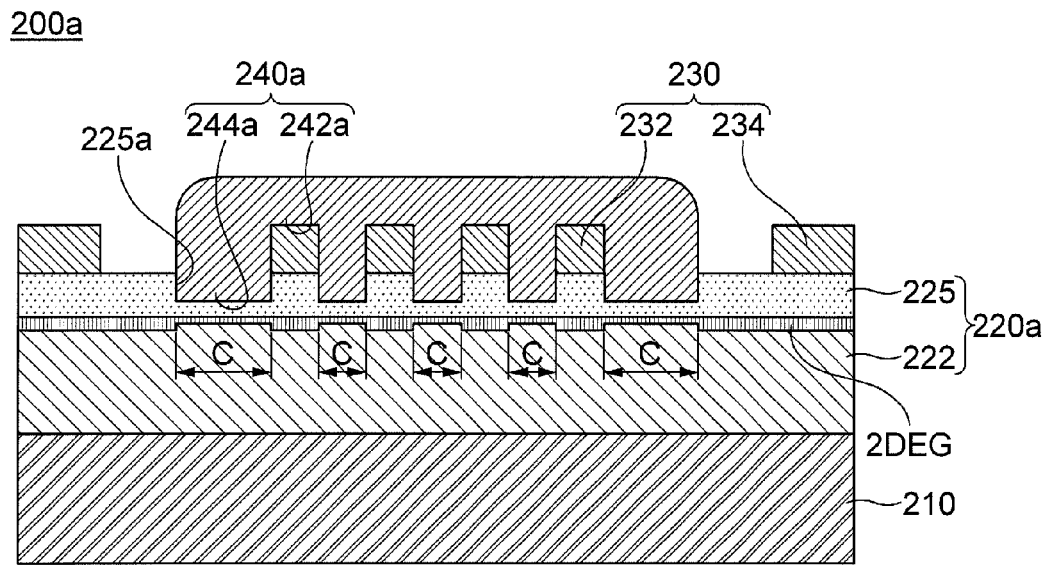
FIG. 19 is a cross-sectional view taken along a line VI-VI' of FIG. 18.

FIG. 18 is a plane-view showing a modified example of a semiconductor device in accordance with other embodiment of the present invention, and FIG. 19 is a cross-sectional view taken along a line VI-VI" of FIG. 18.

Referring to FIGS. 18 and 19, the semiconductor device 200a in accordance with one modified embodiment of the present invention may include a base substrate 210, a semiconductor layer 220a, an ohmic electrode part 230, a Schottky electrode part 240a. The semiconductor layer 220a may include the first nitride film 222 and a second nitride film 225 sequentially stacked on the base substrate 210. The first nitride film 222 may be formed of GaN, and the second nitride film 225 may be formed of AlGaN. A 2DEG may be generated on a boundary of the first and second nitride films. The ohmic electrode part 230 may include a plurality of first ohmic electrodes 232, and a second ohmic electrode 234, wherein the first ohmic electrodes have an island-shaped cross section on a central region of the second nitride film 225, and the second ohmic electrode has a ring shape formed along edge regions of the second nitride film 225. The Schottky electrode part 240a may be formed to entirely cover the first ohmic electrodes 232 on the central region A1 of the second nitride film 225. The Schottky electrode part 240a may have first bonding portions 242a bonded to the first ohmic electrodes 232, and a second bonding portion 244a bonded to the semiconductor layer 220 adjacent to the first ohmic electrodes 232.

Meanwhile, the second bonding portion 244a of the Schottky electrode part 240a may be extended to inside of the second nitride film 224. For example, the second bonding portion 244a may be extended downward from a top part of the second nitride film 225, and may be disposed to be spaced apart from the first nitride film 222. To this end, recesses 225a may be provided in exposed portions of the second nitride film 225 on the middle regions between the first ohmic electrodes 232 and the second ohmic electrode 234. The recesses 225a may be formed within a region of the second nitride film 225 adjacent to the first ohmic electrodes 232.

Herein, concentration of the 2DEG adjacent to the second bonding portion 244a may be controlled by controlling depth of the second bonding portion 244a provided within the second nitride film 225. For example, the deeper the depth of the second bonding portion 244a (that is, as a bottom surface of the second bonding portion 244a becomes adjacent to the first nitride film 222), the relatively thinner the thickness of the second nitride film 225 adjacent to the first nitride film 222. Thus, the concentration of the 2DEG within the semiconductor layer 220a adjacent to the edge portions 244a may be reduced. On the contrary, the thinner the depth of the second bonding portion 244a (that is, as the bottom surface of the second bonding portion 244a becomes far from the first nitride film 222), the relatively thicker the thickness of the second nitride film 225. In this case, the concentration of the 2DEG of an internal region C of the semiconductor layer 220a adjacent to the second bonding portion 244a may be increased.

The semiconductor device 200a in accordance with one modified embodiment of the present invention may include the Schottky electrode part 240a having the second bonding portion 244a extending to inside of the second nitride film 225. In this case, an on-voltage of the semiconductor device 200 can be controlled by controlling the depth of the second bonding portion 244a extending to inside of the semiconductor layer 220a. For example, when the second bonding portion 244a of the Schottky electrode part 240a are allowed to be deep above a predetermined level, it is possible to reduce the 2DEG of C region of the semiconductor layer 220 adjacent to the second bonding portion 244a. Further, when the second bonding portion 244a is allowed to be deeper, it is possible to remove the 2DEG of C region of the semiconductor layer 220a adjacent to the edge portions 244a. The semiconductor device 200a can reduce a reverse leakage current.

Continuously, a detailed description will be given of a method for manufacturing the semiconductor device 200a in accordance with one modified embodiment of the present invention. Herein, the repeated description for the semiconductor device 200a will be omitted or simplified.

Figure 20A:
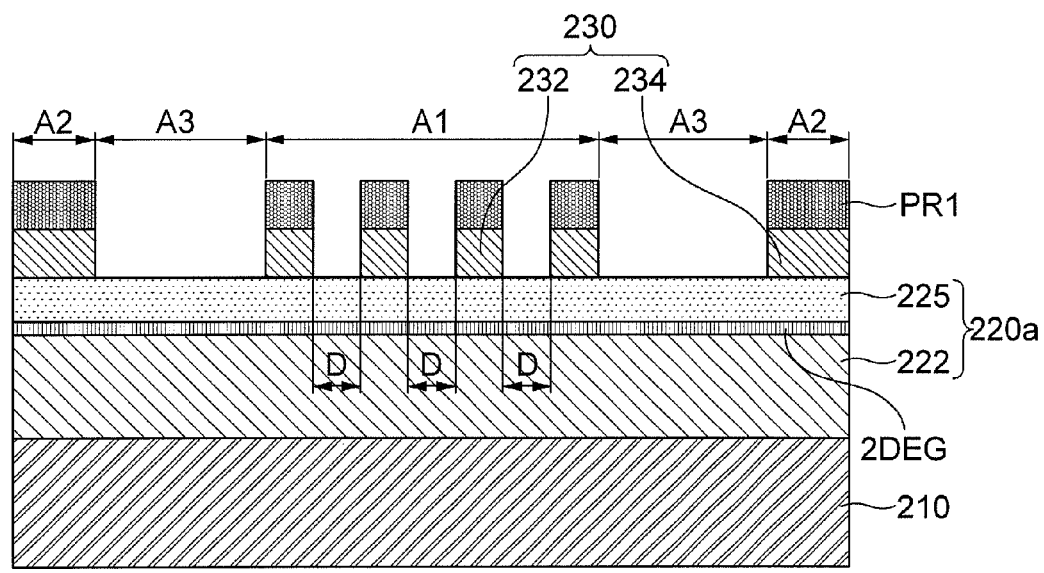
FIGS. 20A to 20C are views showing a method for manufacturing the semiconductor having been described with reference to FIGS. 18 and 19.
Figure 20B:
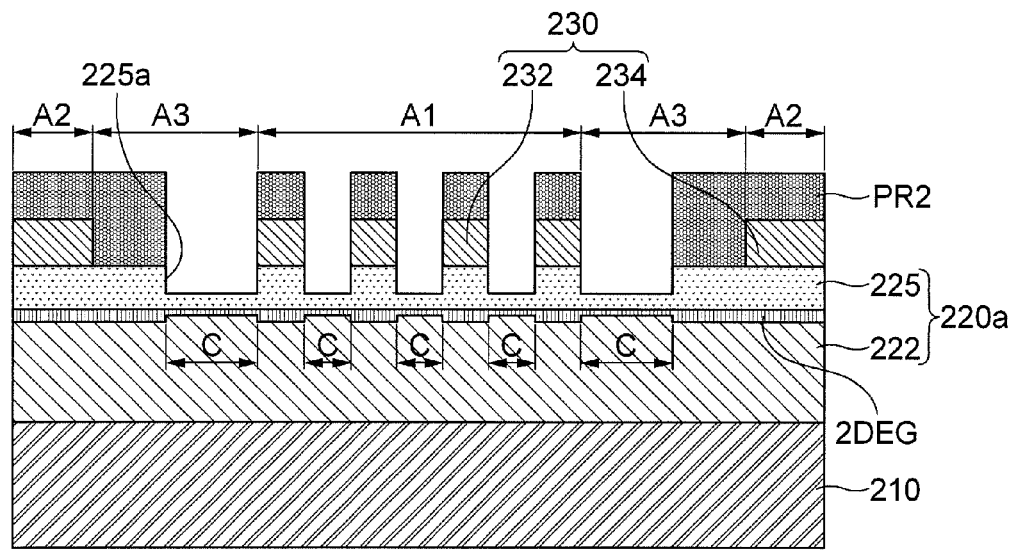
Figure 20C:
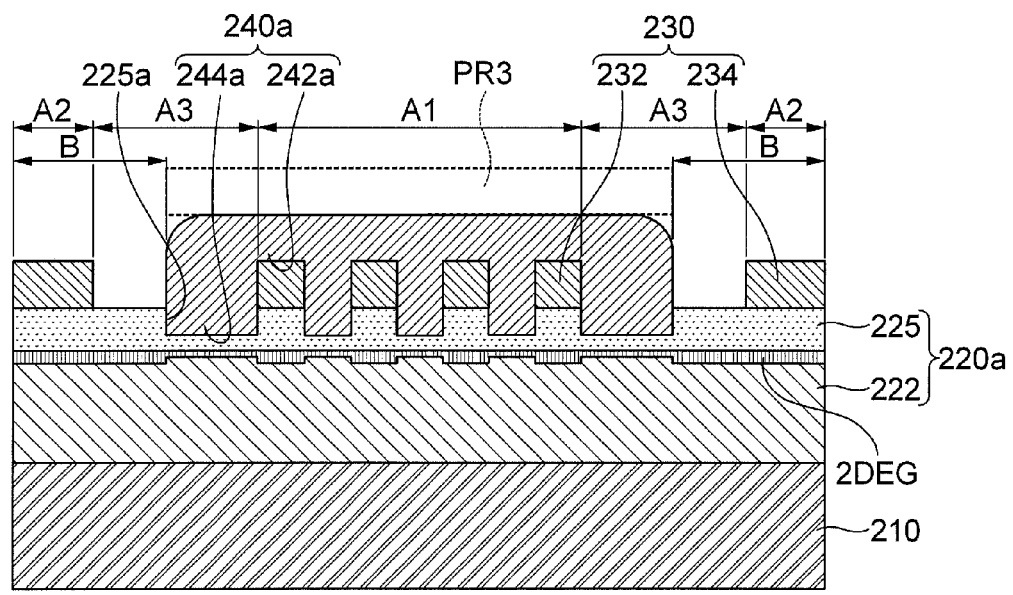

FIGS. 20A to 20C are views showing methods for manufacturing the semiconductor device in accordance with one modified embodiment of the present invention having been described with reference to FIGS. 18 and 19, respectively.

Referring to FIG. 20A, the base substrate 110 may be prepared. The semiconductor layer 220 may be formed on the base substrate 210. The step of forming the semiconductor layer 220 may include a step of forming the first nitride film 222 and the second nitride film 225 on the base substrate 210 in a sequential manner. For example, a step of forming the first nitride film 222 may include a step of growing a GaN film on the base substrate 210 by using the base substrate 210 as a seed layer, and a step of forming the second nitride film 225 includes a step of growing an AlGaN film on the first nitride film 222 by using the first nitride film 222 as a seed layer.

The ohmic electrode part 230 may be formed on the second nitride film 225. For example, a first metal film which covers all surfaces of the resultant second nitride film 225 may be formed, and the first photoresist pattern PR1 which partially exposes the first metal film may be formed. The first photoresist pattern PR1 can expose a region (d) excluding a lattice-shaped region where the middle regions A3 of the semiconductor layer 220 and the first ohmic electrodes 232 are to be formed. Thereafter, it is possible to perform an etching process of the first metal film by using the first photoresist pattern PR1 as an etching mask. Thus, a plurality of the first ohmic electrodes 232 disposed to be in a lattice configuration may be formed on the central region A1 simultaneously while the ring-shaped second ohmic electrode 234 may be formed on the edge regions A2. For example, the first ohmic electrodes 232 and the second ohmic electrode 234 may be formed in an in-situ scheme. The first photoresist pattern PR1 may be removed after the etching process is performed.

Referring to FIG. 20B, the recesses 225a may be formed within the second nitride film 225. For example, the second photoresist pattern PR2 which exposes a part of the middle regions A3 may be formed on the second nitride film 225. The part of the middle regions A3 may be a region spaced apart from the edge regions A2 from among electrodes disposed on the outermost of the first ohmic electrodes 232. It is possible to perform an etching process which removes an exposed part of the second nitride film 225 by using the second photoresist pattern PR2 as an etching mask. Thus, the recesses 225a may be formed on the middle regions A3 of the second nitride film 225. Herein, the concentration of the 2DEG of an internal region C of the semiconductor layer 220a adjacent to the recesses 225a can be controlled according to on the depths of the recesses 225a. Therefore, it is possible to perform the etching process in consideration of the concentration of the 2DEG of the internal region C of the semiconductor layer 220a adjacent to the recesses 225a. After the recesses 225a are formed, the first photoresist pattern PR1 can be removed.

Referring to FIG. 20C, the Schottky electrode part 240a may be formed. For example, a second metal film for covering the resultant ohmic electrode part 230 may be formed. In this case, the second metal film may be formed to cover entirely the semiconductor layer 220a while being buried in the recesses 225a formed on the second nitride film 225 of the semiconductor layer 220a. Then, the second metal film on the edge regions A2 may be removed. For example, a step of forming a third photoresist pattern PR3, which exposes the edge regions A2 and a partial region B of the middle regions A3, on the second metal film, and a step of etching the second metal film by using the third photoresist pattern PR3 as an etching mask may be included. Thus, on the semiconductor layer 220a, the Schottky electrode part 240a may be formed that entirely covers the first ohmic electrodes 232 and the second bonding portion 244a is extended to inside of the second nitride film 224. Thus, the Schottky electrode part 240a is engaged with the first ohmic electrodes 232 to thereby have a prominence and depression structure up and down.

Figure 21:
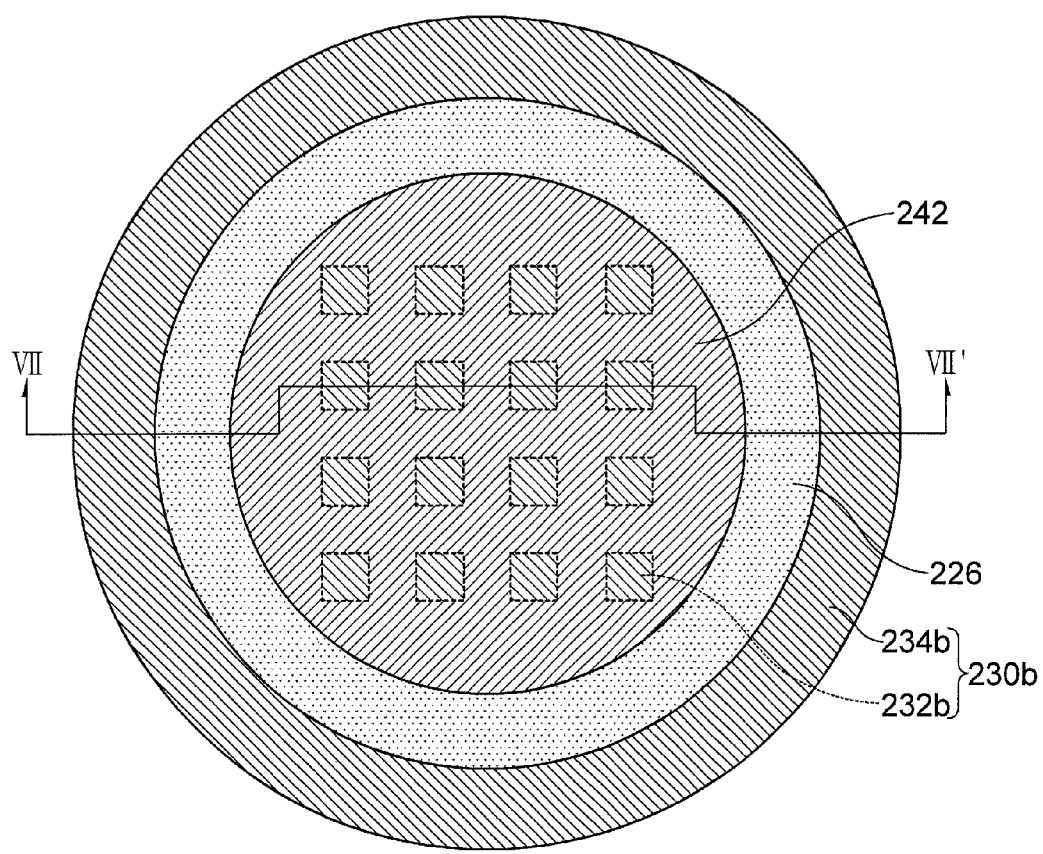
FIG. 21 is a plane-view showing other modified example of a semiconductor device in accordance with other embodiment of the present invention.
Figure 22:
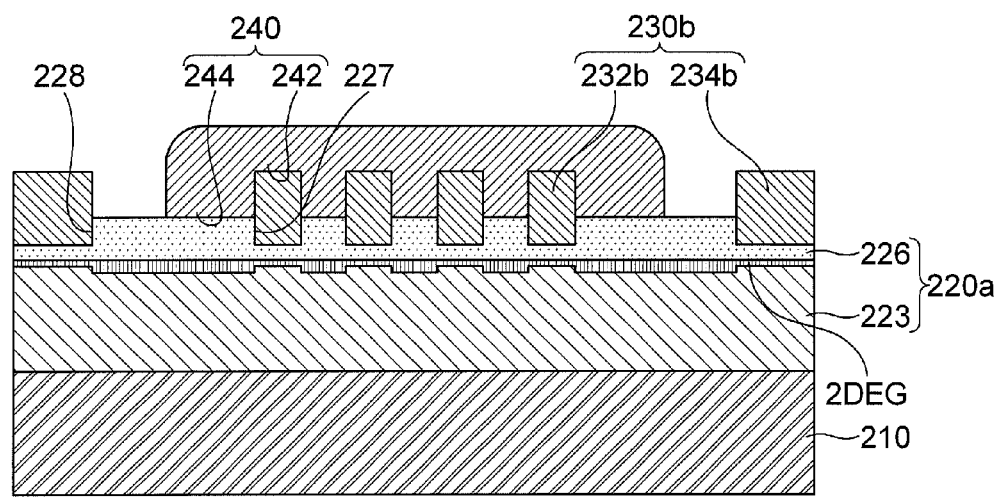
FIG. 22 is a cross-sectional view taken along a line VII-VII' of FIG. 21.

FIG. 21 is a plane-view showing another modified example of the semiconductor device in accordance with one embodiment of the present invention. FIG. 22 is a cross-sectional view taken along a line VII-VII' shown in FIG. 21.

Referring to FIGS. 21 and 22, the semiconductor device 200b in accordance with another modified embodiment of the present invention may include the base substrate 210, a semiconductor layer 220b, an ohmic electrode part 230b, and the Schottky electrode part 240. The semiconductor layer 220b may include a first nitride film 223 and a second nitride film 126 sequentially stacked on the base substrate 210. A 2DEG may be generated on a boundary between the first and second nitride films. The ohmic electrode part 230b may include a plurality of first ohmic electrodes 232b, and a second ohmic electrode 234b, wherein the first ohmic electrodes 232b are formed to have an island-shaped cross section on the central region of the second nitride film 226, and the second ohmic electrode 234b has a ring shape formed along an edge region of the second nitride film 226. Then, the Schottky electrode part 240 may be formed to entirely cover the first ohmic electrodes 232b on the central region of the semiconductor layer 220b. The Schottky electrode part 240 may include the first bonding portions 242 bonded to the first ohmic electrodes 232b, and the second bonding portion 244 bonded to the semiconductor layer 220b adjacent to the first ohmic electrodes 232b. Thus, the edge portion of the Schottky electrode part 240 may be disposed to be spaced apart from the second ohmic electrode 234b.

Meanwhile, the ohmic electrode part 230b may be extended to the inside of the semiconductor layer 220b. For example, the first ohmic electrodes 232b and the second ohmic electrode 234b may be formed to be extended to the inside of the second semiconductor layer 226, and may be formed to be spaced apart from the first semiconductor layer 223. To this end, the semiconductor layer 220b may have first and second recess 227 and 228 formed thereon. The first recesses 227 may be trenches in which the first ohmic electrodes 232b are buried, and the second recess 228 may be trenches in which the second ohmic electrode 234b is buried. Although the present embodiment has been illustrated taking an example where the first recesses 227 have the same depths as those of the second recess 228, depths of the first and second recess 227 and 228 may be selectively differed from each other.

The semiconductor device 200b can control the concentration of the 2DEG generated on the semiconductor layer 220b by controlling the depth at which the ohmic electrode part 230b is formed inside of the semiconductor layer 220b.

Figure 23:
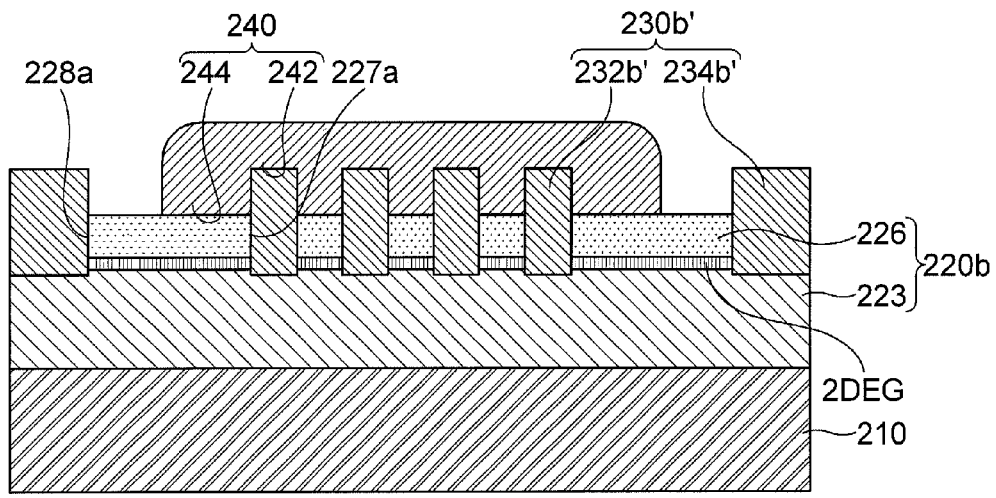
FIG. 23 is a plane-view showing other modified example of a semiconductor device shown in FIG. 21.

FIG. 23 is a view showing another modified example of a semiconductor device shown in FIG. 22. Referring to FIG. 23, a semiconductor device 200b' may have a structure in which the first ohmic electrodes 232b and 234b are extended to the inside of the first nitride film 223, in comparison with the semiconductor device 200b having been described with reference to FIGS. 21 and 22. For example, the first ohmic electrodes 232b and the second ohmic electrode 234b pass through the second semiconductor layer 226 in such a manner to be extended to the inside of the first semiconductor layer 223. In this case, the first ohmic electrodes 232b and the second ohmic electrode 234b may be formed to pass through a location of the 2DEG. To this end, the semiconductor layer 220b may have first and second recess 227a and 228a formed thereon. The first recesses 227a may be trenches in which the first ohmic electrodes 232b are buried, and the second recess 228a may be trench in which the second ohmic electrode 234b is buried. Although the present embodiment has been illustrated taking an example where the first recesses 227a has the same depth as that of the second recess 228a, depths of the first and second recess 227a and 228a may be selectively differed from each other. In the semiconductor device 200b', a current may flow only in a horizontal direction between the first ohmic electrodes 232b and the second ohmic electrode 234b.

Figure 24A:
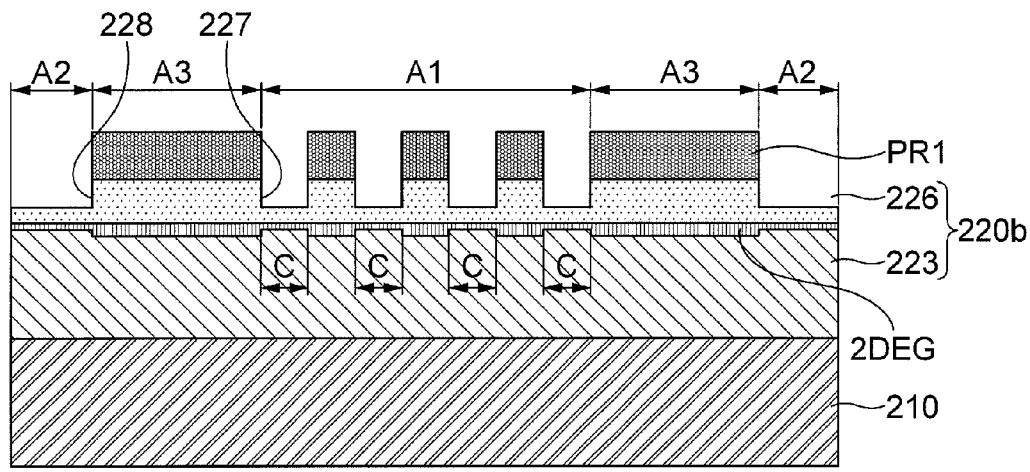
FIGS. 24A to 24C are views showing a method for manufacturing the semiconductor shown in FIGS. 21 and 22.
Figure 24B:
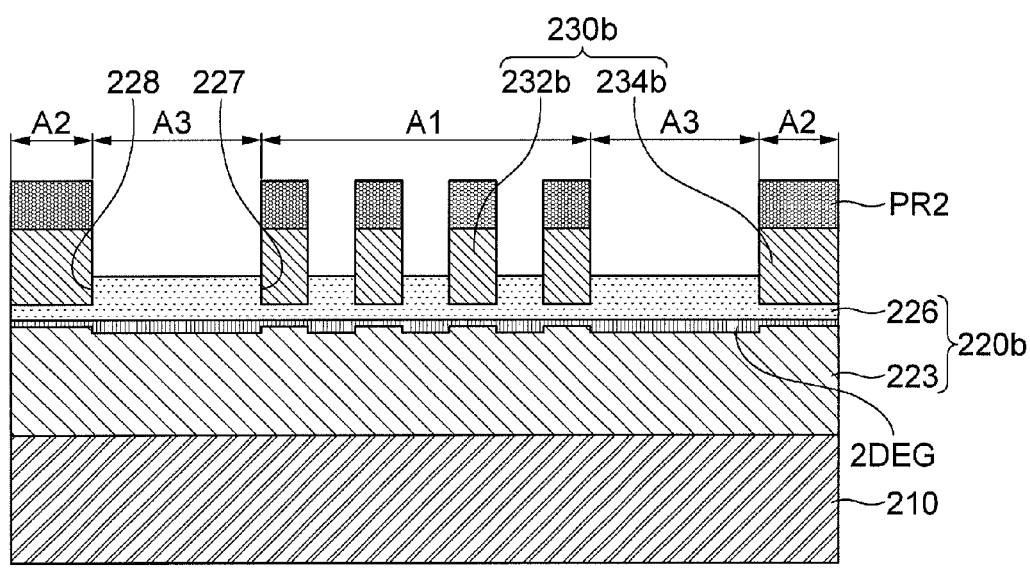
Figure 24C:
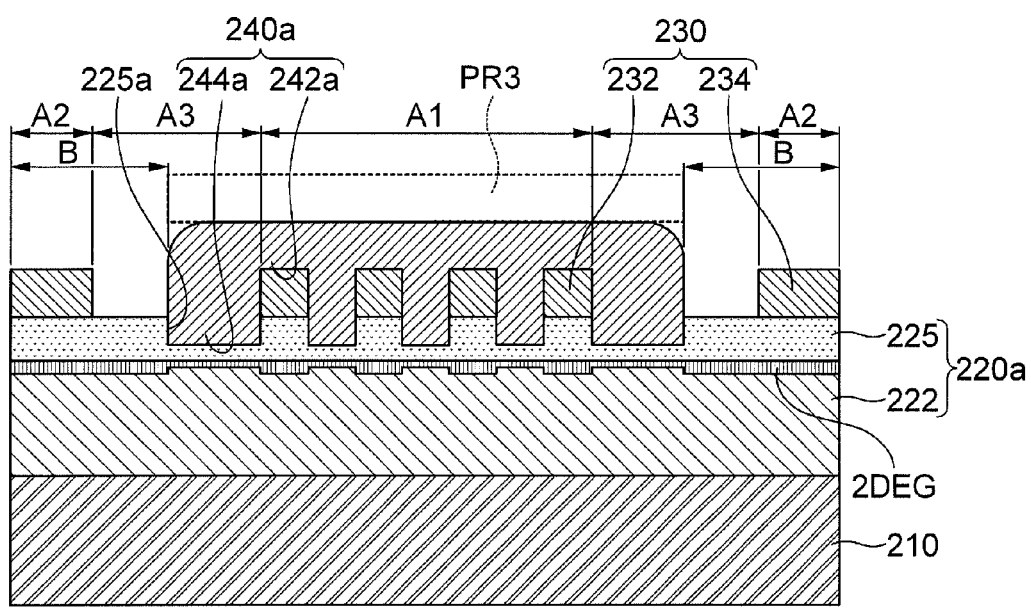

Continuously, a detailed description will be given of a method for manufacturing the semiconductor device 200b in accordance with another modified embodiment of the present invention. FIGS. 24A to 24C are views showing a method for manufacturing the semiconductor device 200b having been described with reference to FIGS. 21 and 22.

Referring to FIG. 24A, the base substrate 110 is prepared, and the first nitride film 223 and the second nitride film 226 may be sequentially formed on the base substrate 210. The first nitride film 223 may include GaN, and the second nitride film 226 may include AlGaN. The first recesses 227 and the second recess 228 may be formed on the second nitride film 226. For example, the first photoresist pattern PR1 may be formed on the second nitride film 226. The first photoresist pattern PR1 can expose a partial region C of the central region A1 and the edge regions A2 of the semiconductor layer 220b. In this case, the partial region C of the central region A1 may be a region where the first ohmic electrodes, indicated by reference numeral 232 of FIG. 24B, are to be formed. It is possible to perform an etching process for etching the semiconductor layer 220b by using the resultant PR1 as an etching mask. For example, in the etching process, depths of the first recesses 227 and the second recess 228 are extended to inside of the second nitride film 226, and they can be controlled to be spaced apart from the first nitride film 223. When the etching process is performed, the first photoresist pattern PR1 may be removed. Herein, the concentration of the 2DEG of the internal region C of the semiconductor layer 220b adjacent to the first and second recess 227 and 228 can be controlled based on the depths of the first and second recess 227 and 228. Therefore, it is possible to perform the etching process in consideration of the concentration of the 2DEG in the internal region C of the semiconductor layer 220b adjacent to the first and second recess 227 and 228.

Referring to FIG. 24B, it is possible to form the ohmic electrode part 230b. For example, it is possible to form a first metal film which covers all surfaces of resultant second nitride film 226 having the first and second recess 227 and 228. Herein, the first metal film may be formed while burring the first and second recess 227 and 228. It is possible to etch the first metal film by using the second photoresist pattern PR2 as the etching mask, after forming the second photoresist pattern PR2 which exposes the first metal film on the regions excluding regions where the first recesses 227 and 228 are formed. Thus, a plurality of the first ohmic electrodes 232b having island-shaped cross sections may be formed in a lattice configuration on the central region A1 of the semiconductor layer 220b, and the second ohmic electrode 234b having a ring shape may be formed on the edge regions A2 of the semiconductor layer 220b.

Referring to FIG. 24C, it is possible to form the Schottky electrode part 240. For example, the second metal film may be formed on a resultant ohmic electrode part 230b. The second metal film may be a film composed of a metallic material different from that of the first metal film for formation of the ohmic electrode part 230b. It is possible to form a PR3, exposing a region B1 including a part of the edge regions A2 and the middle regions A3 on the second metal film, on the second metal film, and to etch the second metal film by using the third photoresist pattern PR3 as an etching mask. Thus, the Schottky electrode part 240a entirely covers the first ohmic electrodes 232b on the central region A1 of the semiconductor layer 220, thereby to have a prominence and depression structure.

Figure 25:
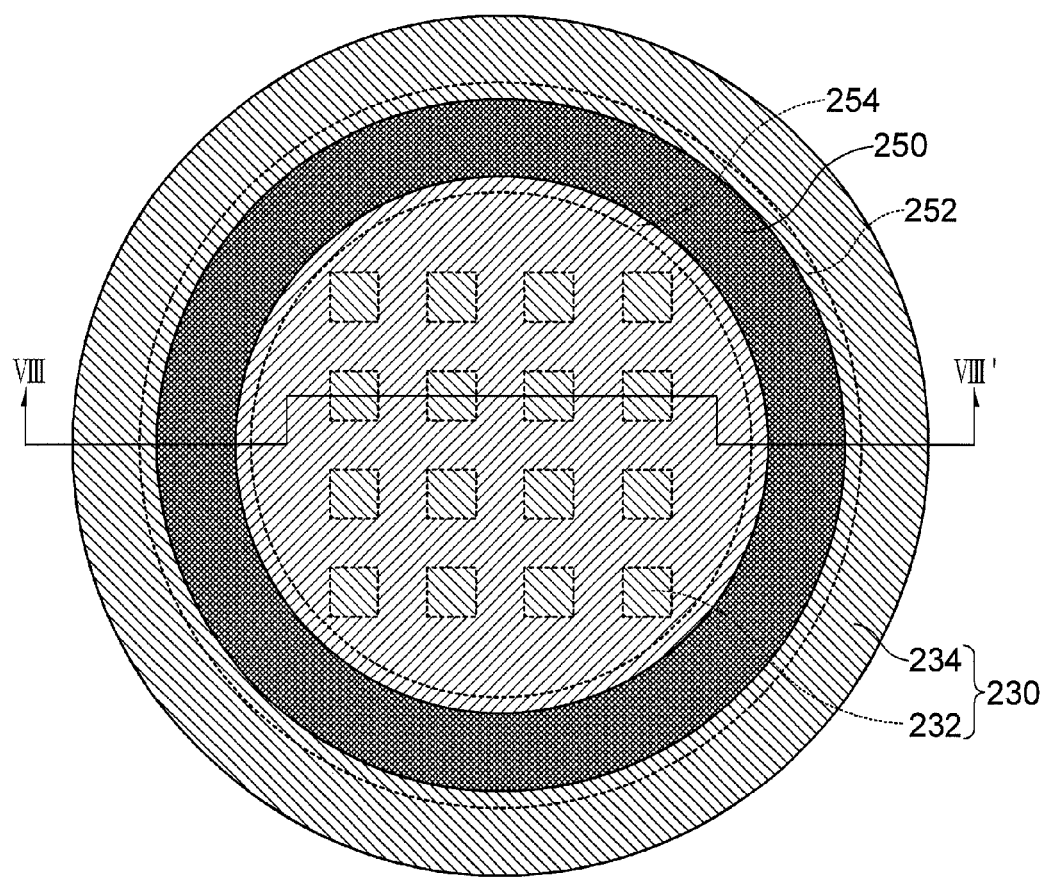
FIG. 25 is a plane-view showing other modified example of a semiconductor device in accordance with other embodiment of the present invention.
Figure 26:
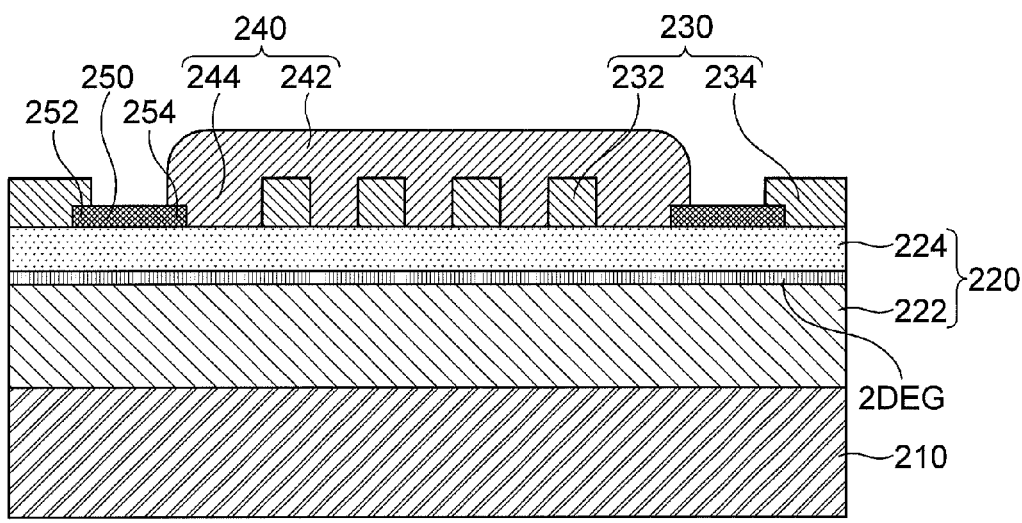
FIG. 26 is a cross-sectional view taken along a line VIII-VIII' of FIG. 25.

FIG. 25 is a view showing another modified example of the semiconductor device in accordance with other embodiment of the present invention. FIG. 26 is a cross-sectional view taken along a line VIII-VIII' shown in FIG. 25.

Referring to FIGS. 25 and 26, the semiconductor device 200c in accordance with another modified embodiment of the present invention may include a base substrate 210, a semiconductor layer 220, an ohmic electrode part 230, a Schottky electrode part 240, and a field plate 250. The semiconductor layer 220 may include the first nitride film 222 and the second nitride film 224 sequentially stacked on the base substrate 210. The 2DEG may be generated on the boundary of the first and second nitride films. The ohmic electrode part 230 may include a plurality of first ohmic electrodes 232 and second ohmic electrode 234. The first ohmic electrodes 232 may be disposed on a central region of the second nitride film 224 and have island-shape cross sections. The second ohmic electrode 234 may have a ring shape surrounding the first ohmic electrodes 232 on the edge region of the second nitride film 224. The Schottky electrode part 240 may be formed to entirely cover the first ohmic electrodes 232 on the central region of the second nitride film 224. In addition, the Schottky electrode part 240 may be disposed to be spaced apart from the second ohmic electrode 234. Thus, the Schottky electrode part 240 and the first ohmic electrodes 232 may be configured in a prominence and depression structure in which they are engaged with one another in the semiconductor layer 220.

Meanwhile, the field plate 250 may be disposed on the semiconductor layer 220 between the second ohmic electrode 234 and the Schottky electrode part 240. In this case, external side portions 252 of the field plate 250 may be provided to be partially covered by the second ohmic electrode 234, and internal side portions 254 of the field plate 250 may be provided to be partially covered by the edge portions 244 of the Schottky electrode part 240. The field plate 250 can provide an effect of distributing an electric field concentrated on corner portions of the Schottky electrode part 240 and the ohmic electrode part 230.

Figure 27A:
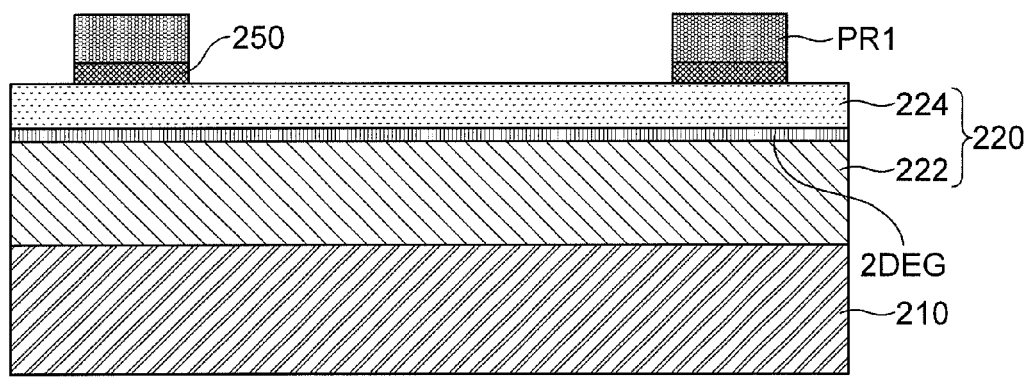
FIGS. 27A to 27C are views showing a method for manufacturing the semiconductor shown in FIGS. 25 and 26.
Figure 27B:
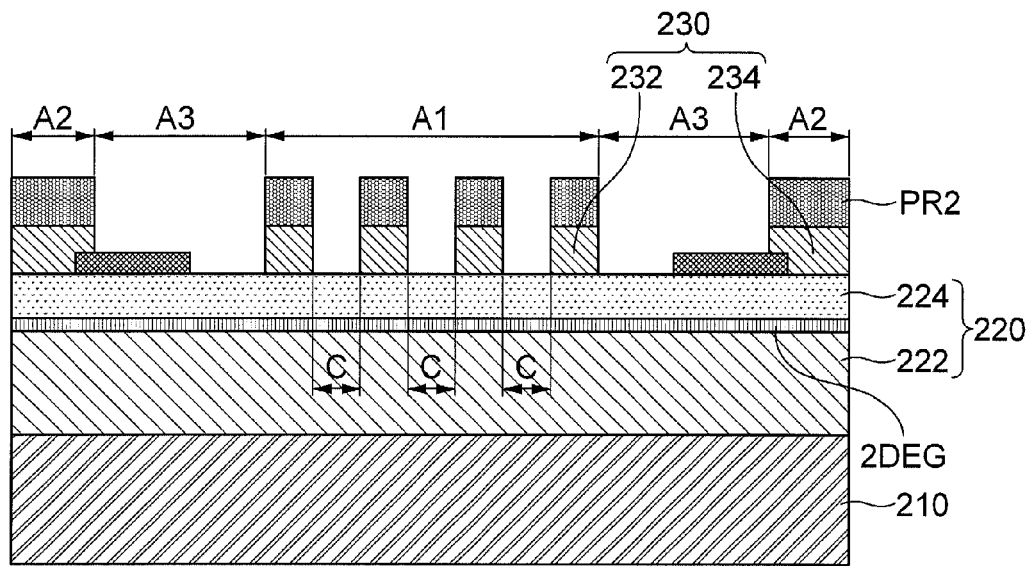
Figure 27C:
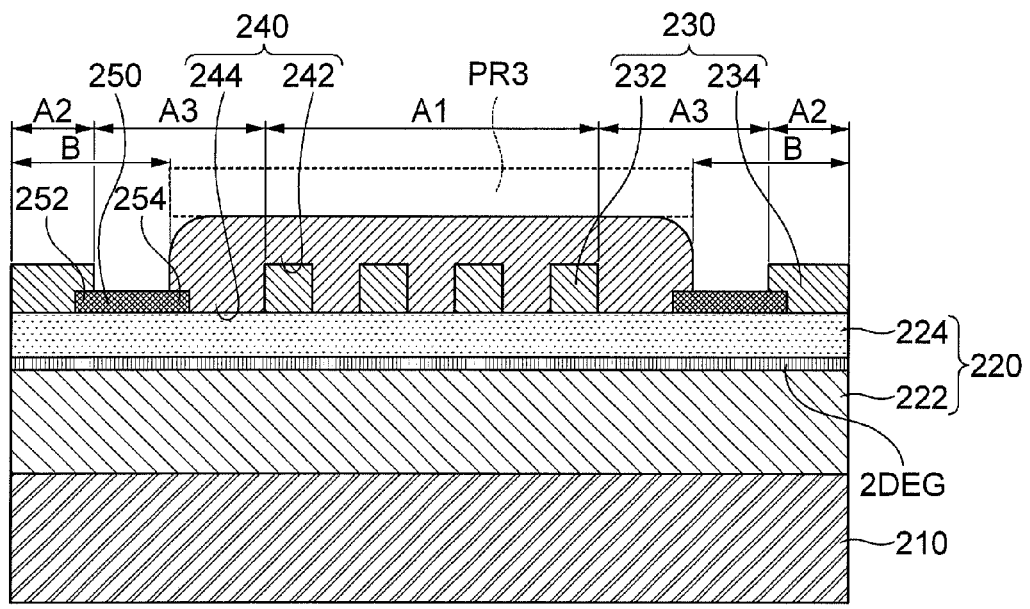

Continuously, a detailed description will be given of a method for manufacturing a semiconductor device 200c in accordance with another modified embodiment of the present invention. FIGS. 27A to 27C are views showing methods for manufacturing a semiconductor device 200c having been described with reference to FIGS. 25 and 26, respectively.

Referring to FIG. 27A, the base substrate 210 is prepared, and the first nitride film 222 and the second nitride film 224 may be sequentially formed on the base substrate 210. The first nitride film 222 may include GaN, and the second nitride film 224 may include AlGaN.

The field plate 250 may be formed. A step of forming the field plate 250 may include a step of forming an insulating film on the second nitride film 224 in a conformal manner, a step of forming the first photoresist pattern PR1, which exposes a central region and edge regions of the insulating film, on the insulating film, and a step of etching the insulating film by using the first photoresist pattern PR1 as an etching mask. Thus, the field plate 250 disposed between the central region and the edge regions of the semiconductor layer 220 may be formed on the semiconductor layer 220. After the field plate 250 is formed, the first photoresist pattern PR1 may be removed.

Referring to FIG. 27B, the ohmic electrode part 230 may be formed. For example, the first metal film may be formed that entirely covers the resultant field plate 250. Then, the second photoresist pattern PR2 may be formed on the first metal film. The second photoresist pattern PR2 can expose the first metal film on the middle regions A3 between the central region A1 and the edge regions A2. The part of the central region A1 may be a region excluding a region where the first ohmic electrodes 232 are to be formed. In addition, the second photoresist pattern PR2 may be provided such that the first metal film on the external side portions 252 of the field plate 250 fails to be exposed. Thereafter, it is possible to etch the first metal film by using the second photoresist pattern PR2 as an etching mask. Thus, a plurality of the first ohmic electrodes 232 having an island-shaped cross section may be formed in a lattice configuration on the central region A1 of the semiconductor layer 220, and the second ohmic electrode 234 having a ring shape may be formed on the edge regions A2 of the semiconductor layer 220. Herein, the second ohmic electrode 234 may be formed to partially cover the external side portions 252 of the field plate 250. In this case, it is possible to distribute an electric field concentrated on the corner portions of the second ohmic electrode 234 being in contact with the field plate 250.

Referring to FIG. 27C, the Schottky electrode part 240 may be formed. For example, the second metal film may be formed on the resultant ohmic electrode part 230. The second metal film may be a film of a metallic material different from that of the first metal film for formation of the ohmic electrode part 230. It is possible to form the third photoresist pattern PR3, which exposes a region B including a part of the edge regions A2 and the middle regions A3, on the second metal film. In addition, the third photoresist pattern PR3 may be provided such that the second metal film on the internal side portions 254 of the field plate 250 fails to be exposed. Thereafter, it is possible to etch the second metal film by using the third photoresist pattern PR3 as an etching mask. Thus, it is possible to form the Schottky electrode part 240 which entirely covers the first ohmic electrodes 232b on the central region A1 of the semiconductor layer 220. The Schottky electrode part 240, entirely cover the first ohmic electrode part 232b to thereby have a prominence and depression structure in which they are engaged with the first ohmic electrodes 232b up and down, may be formed on the central region A1 of the semiconductor layer 220. Also, the Schottky electrode part 240 may be formed to partially cover the internal side portions 254 of the field plate 250. In this case, it is possible to distribute an electric field concentrated on corner portions of the Schottky electrode part 240 being in contact with the field plate 250.

Figure 28:
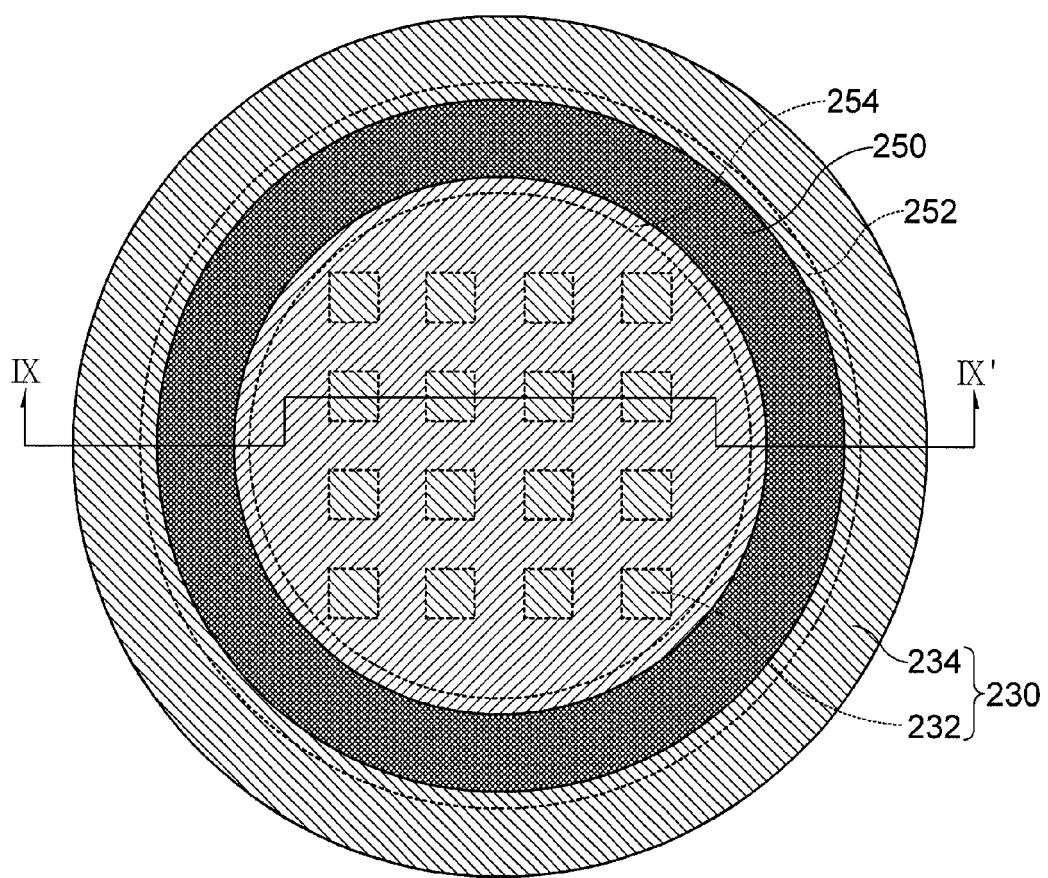
FIG. 28 is a plane-view showing other modified example of a semiconductor device in accordance with other embodiment of the present invention.
Figure 29:
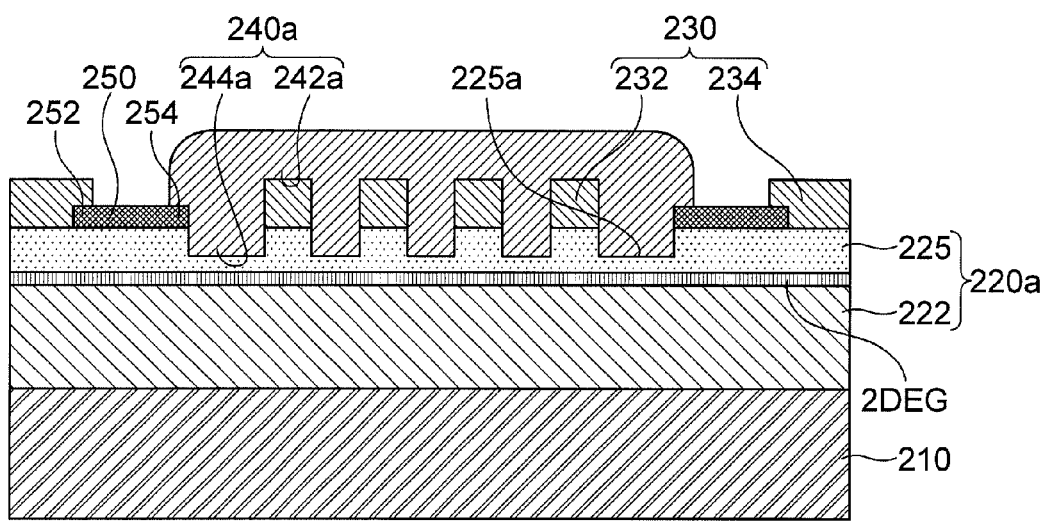
FIG. 29 is a cross-sectional view taken along a line IX-IX' of FIG. 28.

FIG. 28 is a view showing a semiconductor device in accordance with other embodiments of the present invention, and FIG. 29 is a cross-sectional view taken along a line IX-IX' of FIG. 28.

Referring to FIGS. 28 and 29, a semiconductor device 200d in accordance with another modified embodiment of the present invention may include a base substrate 210, a semiconductor layer 220a, an ohmic electrode part 230, a Schottky electrode part 240a, and a field plate 250. The semiconductor layer 220 may include a first nitride film 222 and a second nitride film 224 sequentially stacked on the base substrate 210. A 2DEG may be generated on a boundary between the first and second nitride films. The ohmic electrode part 230 may include a plurality of first ohmic electrodes 232, and a second ohmic electrode 234, wherein the first ohmic electrodes 232 are disposed on the central region of the second nitride film 22 and have an island shape cross section, and the second ohmic electrode 234 has a ring shape surrounding first ohmic electrodes 232 on an edge region of the second nitride film 225. The Schottky electrode part 240 may be formed to entirely cover the first ohmic electrodes 232 on the central region of the second nitride film 225. In addition, the Schottky electrode part 240 may be disposed to be spaced apart from the second ohmic electrode 234. Thus, the Schottky electrode part 240 and the first ohmic electrodes 232 may be configured to have a prominence and depression structure in which they are engaged with one another in the semiconductor layer 220.

Meanwhile, the first and second bonding portions 242a and 244a of the Schottky electrode part 240a may be extended to inside of the second nitride film 225. For example, the first and second bonding portions 242a and 244a may be extended downward from a top part of the second nitride film 225, and may be disposed to be spaced apart from the first nitride film 222. To this end, recesses 225a may be provided in exposed parts of the second nitride film 225 on the middle region between the first ohmic electrodes 232 and the second ohmic electrode 234. The recesses 225a may be formed on the second nitride film 225 adjacent to the first ohmic electrodes 232. The recesses 225a may be formed on the second nitride film 225 between the first ohmic electrodes 232.

Also, the field plate 250 may be disposed on the semiconductor layer 220 between the second ohmic electrode 234 and the Schottky electrode part 240. In this case, external side portions 252 of the field plate 250 may be provided to be partially covered by the second ohmic electrode 234, and internal side portions 254 of the field plate 250 may be provided to be partially covered by the edge portions 244 of the Schottky electrode part 240. The field plate 250 can provide an effect of distributing an electric field concentrated on corner portions of the Schottky electrode part 240 and the ohmic electrode part 230.

The semiconductor device 200d may have a structure formed by combining a structure of the semiconductor device 200a of one modified embodiment of the present invention with a structure of the semiconductor device 200c of another modified embodiment of the present invention.

Figure 30A:
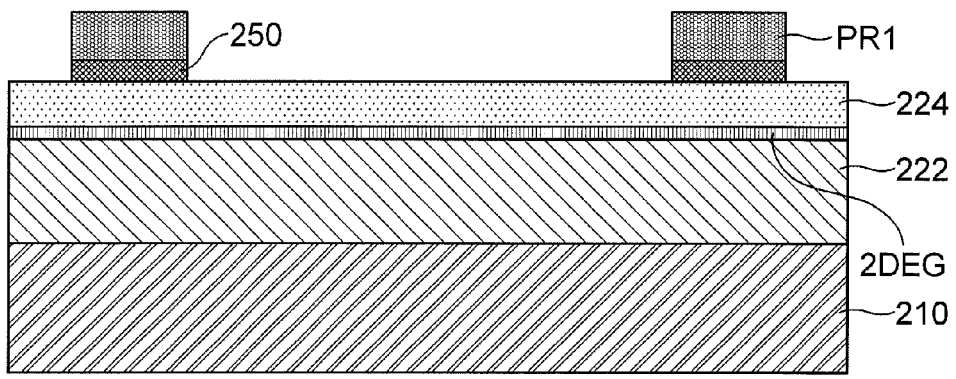
FIGS. 30A to 30C are views showing a method for manufacturing the semiconductor shown in FIGS. 28 and 29.
Figure 30B:
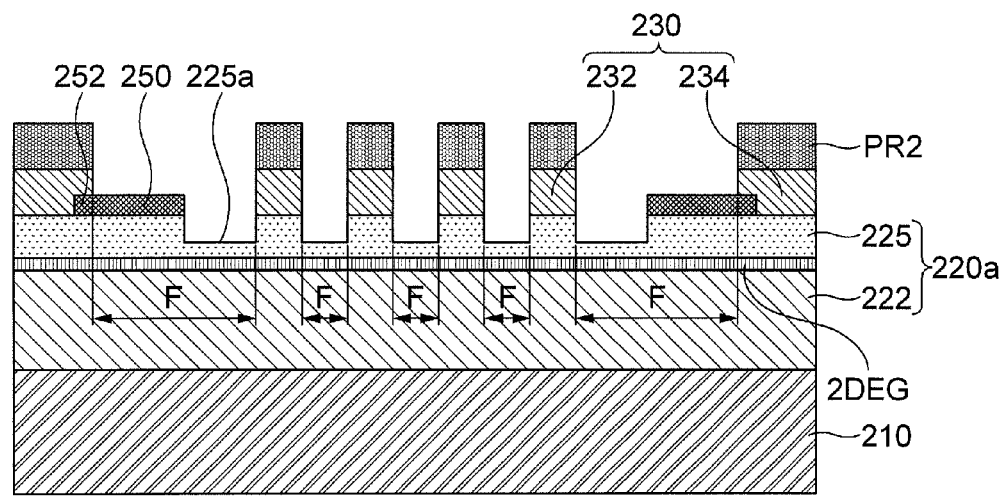
Figure 30C:
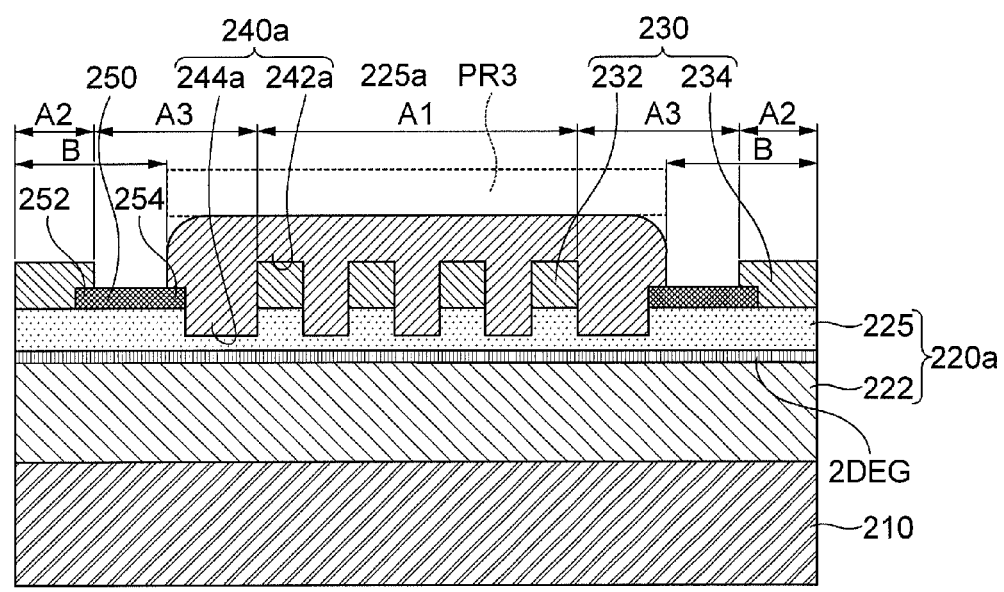

Continuously, a detailed description will be given of a method for manufacturing a semiconductor device 100d in accordance with another modified embodiment of the present invention. FIGS. 30A to 30C are views showing methods for manufacturing the semiconductor device shown in FIGS. 28 and 29, respectively.

Referring to FIG. 30A, the base substrate 210 is prepared, and the first nitride film 222 and the second nitride film 224 may be sequentially formed on the base substrate 210. The first nitride film 222 may include GaN, and the second nitride film 224 may include AlGaN.

The field plate 250 may be formed. For example, a step of forming the insulating film on the second nitride film 224 in a conformal manner, a step of forming the first photoresist pattern PR1, which exposes a central region and an edge region of the insulating film, on the insulating film, a step of etching the insulating film by using the first photoresist pattern PR1 as an etching mask, and a step of removing the first photoresist pattern PR1 may be sequentially performed. Thus, the field plate 250 disposed between the central region and the edge regions of the semiconductor layer 220 may be formed on the semiconductor layer 220.

Referring to FIG. 30B, the ohmic electrode part 230 may be formed. For example, a step of forming the first metal film which covers all surfaces of the resultant field plate 250, a step of forming the second photoresist pattern PR2 which partially exposes the first metal film, a step of etching the first metal film by using the second photoresist pattern PR2 as an etching mask, and a step of removing the second photoresist pattern PR2 may be sequentially performed. Herein, the second photoresist pattern PR2 may expose a region F on the semiconductor layer 220, excluding a region where the first ohmic electrodes 232 and the second ohmic electrode 234 are to be formed. In this case, the process of etching the first metal film may be an etching process having an etching selection ratio for the field plates. In addition, the second photoresist pattern PR2 can be provided such that the first metal film on the external side portions 252 of the field plate 250 fails to be exposed. Thus, a plurality of first ohmic electrodes 232 having island shape cross sections may be formed in a lattice configuration on the central region A1 of the semiconductor layer 220, and the second ohmic electrode 234 having a ring shape may be formed on the edge regions A2 of the semiconductor layer 220. Also, the second ohmic electrode 234 may be formed to partially cover the external side portions 252 of the field plate 250.

Referring to FIG. 30C, the Schottky electrode part 240a may be formed. For example, the second metal film may be formed on the resultant ohmic electrode part 230. The second metal film may be a film composed of a metallic material different from that of the first metal film. The third photoresist pattern PR3, which exposes regions B including a part of the edge regions A2 and the middle regions A3, may be formed on the second metal film. In addition, the third photoresist pattern PR3 may be provided such that the second metal film on the internal side portions 254 of the field plate 250 fails to be exposed. Thereafter, it is possible to etch the second metal film by using the third photoresist pattern PR3 as an etching mask. Thus, the Schottky electrode part 240a entirely covers the first ohmic electrodes 232b on the central region A1 of the semiconductor layer 220 to thereby have a prominence and depression structure in which it is engaged with the first ohmic electrodes 232b up and down. The Schottky electrode part 240a may include the first bonding portions 242a and the second bonding portion 244a, wherein the first bonding portions 242a are bonded the first ohmic electrodes 232, and the second bonding portion 244a are bonded to the second nitride film 225 on the recesses 225a.

Also, the Schottky electrode part 240a may be formed to cover a part of the internal side portions 254 of the field plates 252.

Figure 31:
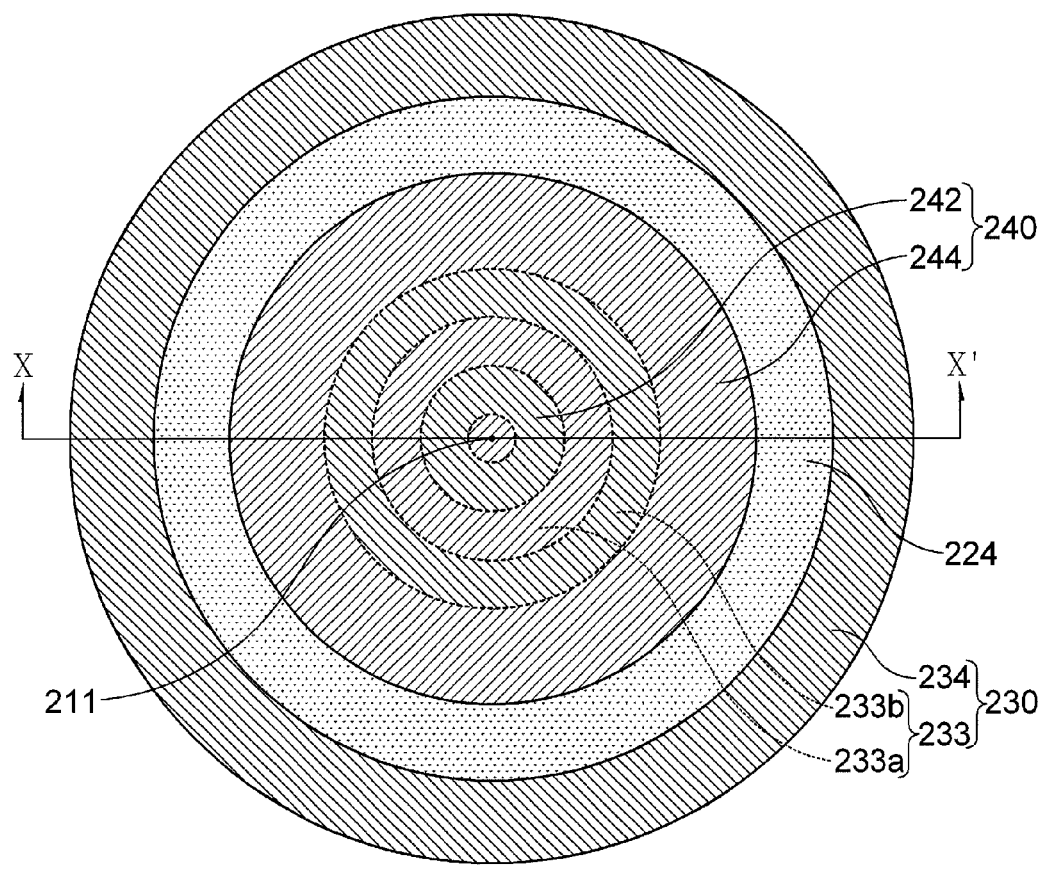
FIG. 31 is a plane-view showing other modified example of a semiconductor device in accordance with other embodiment of the present invention.
Figure 32:
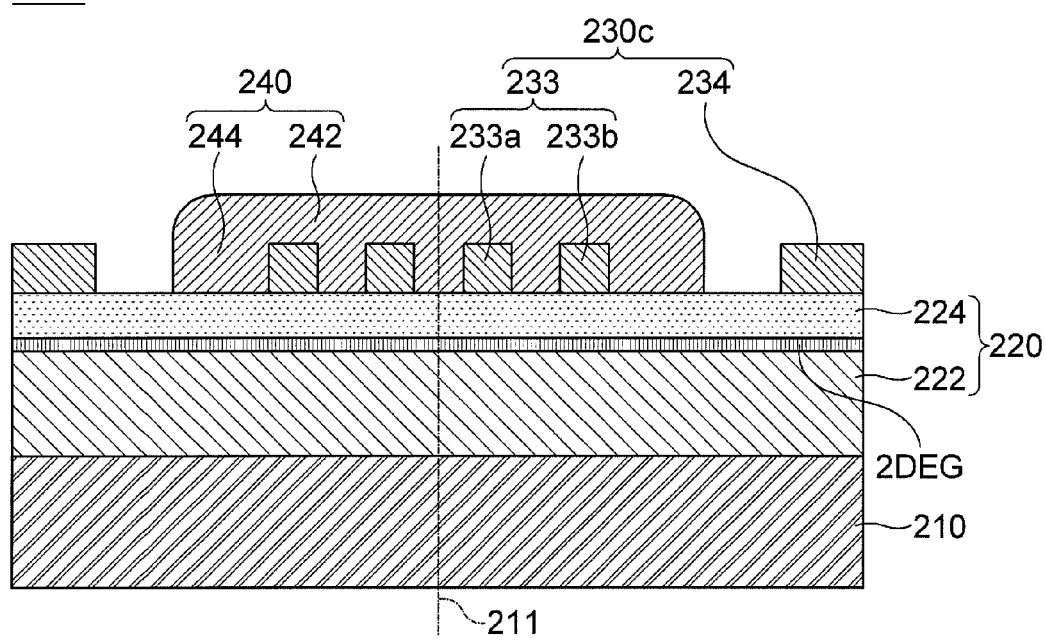
FIG. 32 is a cross-sectional view taken along a line X-X' of FIG. 31.

FIG. 31 is a view showing other modified example of the semiconductor device in accordance with another embodiment of the present invention. FIG. 32 is a cross-sectional view taken along a line X-X' of FIG. 31.

Referring to FIGS. 31 and 32, the semiconductor device 200e may include a base substrate 210, a semiconductor layer 220, an ohmic electrode part 230c, and a Schottky electrode part 240. The semiconductor layer 220 may include the first nitride film 222 and the second nitride film 224 sequentially stacked on the base substrate 210, and the 2DEG may be formed on the boundary surface between the nitride films.

The ohmic electrode part 230c may include first ohmic electrodes 233 and second ohmic electrode 234. Each of the first ohmic electrodes may have a ring shape based on the center 211 of the semiconductor layer 220. For example, the first ohmic electrodes 233 may include first electrodes 233a and a second electrode 233b based on the center 211 of the semiconductor layer 220, and the second electrode 233b may have a diameter bigger than those of the first electrodes 233a. Also, the second ohmic electrode 234 may be provided to have a ring shape surrounding the first ohmic electrodes 232 on the edge portion of the second nitride film 224. Thus, the first ohmic electrodes 233 and the second ohmic electrode 234 may mutually share the center 211 of the semiconductor layer 220, and may have a ring shape with a mutually different diameter. The Schottky electrode part 240 may be formed to entirely cover the first ohmic electrodes 232 on the central region of the second nitride film 224. In addition, the Schottky electrode part 240 may be disposed to be spaced apart from the second ohmic electrode 234. Thus, the first ohmic electrodes 232 and the Schottky electrode part 240 may be configured in a prominence and depression structure in which they are engaged with one another up and down.

The semiconductor device 200e having the same structure may be provided with the first ohmic electrodes with a ring-shaped cross section, in comparison with the semiconductor device 200a in accordance with one modified embodiment of the present invention. That is, the first ohmic electrodes 233 and the second ohmic electrode may share the center of the semiconductor layer 220, and may be formed in a ring shape with a mutually different diameter. Thus, the first ohmic electrodes 233 and the second ohmic electrode 234 may be in an annual ring shape on the semiconductor layer 220. Since those skilled in the art can enough derive a process of forming the semiconductor device 200e from the methods for manufacturing the semiconductor device of the present invention, the detailed description thereof will be omitted.

In the case where the semiconductor device of the present invention is driven in a forward direction, when a driving voltage is higher than an on-votlge of the Schottky didoe, a current flows through an ohmic electrodes and Schottky electrode portion at the same time. Further, a current flow by the first ohmic electrode posistoned below the Schottky electrode portion even if the driving voltage is lower than the on-voltage of the Schottky didoe. Therefore, in the semiconductor device, forward currents are increased, and thus it is possible to perform operation even at a low driving voltage.

When the semiconductor device of the present invention is driven in a reverse direction, a 2DEG is allowed to be disconnected by a depletion region generated by the Schottky electrode portion to thereby stably block a current flow, which results in high reverse breakdown voltage.

In a method for manufacturing the semiconductor device, forward currents are increased and reverse leakage currents are reduced, so that it is possible to improve power converting efficiency of the semiconductor device, as well as operation speed of the semiconductor device.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:
1. A semiconductor device comprising:
a base substrate;
a semiconductor layer which is disposed on the base substrate and has a 2-Dimensional Electron Gas (2DEG) generated within the semiconductor layer, the semiconductor layer comprising a first nitride film on the base substrate, the first nitride film being formed of P-type having high resistivity, thereby reducing a leakage current of the semiconductor device, and a second nitride film which is disposed on the first nitride film and has an energy band gap wider than that of the first nitride film;
a plurality of first ohmic electrodes which are disposed on the central region of the semiconductor layer and have island-shaped cross sections;
a second ohmic electrode which is disposed directly on edge regions of the semiconductor layer, the second ohmic electrode being formed in a ring shape surrounding the first ohmic electrode; and
a Schottky electrode part having first bonding portions bonded to the first ohmic electrodes, and a second bonding portion bonded to the semiconductor layer,
wherein a depletion region is provided to be spaced apart from the 2DEG when the semiconductor device is driven at an on-voltage and is provided to be expanded to the 2DEG when the semiconductor device is driven at an off-voltage, the depletion region being generated within the semiconductor layer by bonding the semiconductor layer and the second bonding portion,
the Schottky electrode part has a prominence and depression structure in which the Schottky electrode part is engaged with the first ohmic electrodes up and down.
2. The semiconductor device of claim 1, wherein the first bonding portions are bonded to the first ohmic electrodes on a top part of the first ohmic electrodes, and the second bonding portion is bonded to a region of the semiconductor layer adjacent to the first ohmic electrodes.
3. The semiconductor device of claim 1, wherein when the semiconductor device is driven at a forward voltage equal to or higher than the on-voltage of the Schottky electrode part, the depletion region is provided to allow a current to flow from the Schottky electrode part to the 2DEG.
4. The semiconductor device of claim 1, wherein, when the semiconductor device is driven at a forward voltage lower than the on-voltage of the Schottky electrode part, the depletion region blocks a current flow from the Schottky electrode part to the 2DEG.

5. The semiconductor device of claim 1, wherein, when the semiconductor device is driven at a reverse voltage, the depletion region blocks a current flow from the first ohmic electrodes to the 2DEG.

* * * * *